US010937797B2

(12) United States Patent
Seo et al.

(10) Patent No.: US 10,937,797 B2
(45) Date of Patent: Mar. 2, 2021

(54) THREE-DIMENSIONAL SEMICONDUCTOR MEMORY DEVICES

(71) Applicant: Samsung Electronics Co., Ltd., Suwon-si (KR)

(72) Inventors: Seongjun Seo, Hwaseong-si (KR); Hyun-Seok Na, Hwaseong-si (KR); Heejueng Lee, Suwon-si (KR); Heung Jin Joo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/243,236

(22) Filed: Jan. 9, 2019

(65) Prior Publication Data

US 2019/0304991 A1 Oct. 3, 2019

(30) Foreign Application Priority Data

Apr. 3, 2018 (KR) ........................ 10-2018-0038582

(51) Int. Cl.
*H01L 27/11575* (2017.01)
*H01L 27/11524* (2017.01)
(Continued)

(52) U.S. Cl.
CPC .... *H01L 27/11575* (2013.01); *H01L 27/1157* (2013.01); *H01L 27/11524* (2013.01);
(Continued)

(58) Field of Classification Search
CPC ............. H01L 27/11246; H01L 27/115; H01L 27/11514; H01L 27/11524;
(Continued)

(56) References Cited

U.S. PATENT DOCUMENTS 9,484,354 B2 11/2016 Lee et al.
9,536,897 B2 1/2017 Yoo et al.
(Continued)

FOREIGN PATENT DOCUMENTS

KR 10-0515383 B1 9/2005
KR 10-2007-0004352 A 1/2007
(Continued)

*Primary Examiner* — Sonya McCall-Shepard
(74) *Attorney, Agent, or Firm* — Harness, Dickey & Pierce, P.L.C.

(57) ABSTRACT

A three-dimensional semiconductor memory device may include a substrate including a cell array region, a peripheral circuit region, and a connection region between the cell array region and the peripheral circuit region. The memory device may include an electrode structure extending from the cell array region toward the connection region and comprising electrodes stacked on the substrate, a horizontal gate dielectric layer between the electrode structure and the substrate and including a first portion on the cell array region and a second portion on the connection region, the second portion thicker than the first portion in the vertical direction, first vertical channels on the cell array region and penetrating the electrode structure and the first portion of the horizontal gate dielectric layer, and second vertical channels on the connection region and penetrating the electrode structure and the second portion of the horizontal gate dielectric layer.

21 Claims, 20 Drawing Sheets

(51) Int. Cl.
  *H01L 27/11556*  (2017.01)
  *H01L 27/11548*  (2017.01)
  *H01L 29/06*  (2006.01)
  *H01L 27/1157*  (2017.01)
  *H01L 27/11582*  (2017.01)
  *H01L 27/11573*  (2017.01)
  *H01L 27/11529*  (2017.01)
  *H01L 27/11565*  (2017.01)

(52) U.S. Cl.
  CPC .. *H01L 27/11529* (2013.01); *H01L 27/11548* (2013.01); *H01L 27/11556* (2013.01); *H01L 27/11573* (2013.01); *H01L 27/11582* (2013.01); *H01L 29/0649* (2013.01)

(58) Field of Classification Search
  CPC ......... H01L 27/11529; H01L 27/11551; H01L 27/11553; H01L 27/11556; H01L 27/1157; H01L 27/11578; H01L 27/1158; H01L 27/11582; H01L 27/11597; H01L 29/40117
  See application file for complete search history.

(56) References Cited

U.S. PATENT DOCUMENTS

| | | | |
|---|---|---|---|
| 9,601,577 B1* | 3/2017 | Lee | .................. H01L 27/11578 |
| 9,620,512 B1* | 4/2017 | Nishikawa | ........ H01L 27/11531 |
| 9,666,281 B2 | 5/2017 | Sakakibara | |
| 9,728,551 B1 | 8/2017 | Lu et al. | |
| 9,768,193 B2 | 9/2017 | Lee et al. | |
| 2012/0070944 A1 | 3/2012 | Kim et al. | |
| 2015/0079748 A1 | 3/2015 | Kim et al. | |
| 2016/0027796 A1 | 1/2016 | Yang et al. | |
| 2017/0271354 A1 | 9/2017 | Kwak | |

FOREIGN PATENT DOCUMENTS

| | | |
|---|---|---|
| KR | 10-2009-0097425 A | 9/2009 |
| KR | 10-2012-0030193 A | 3/2012 |

* cited by examiner

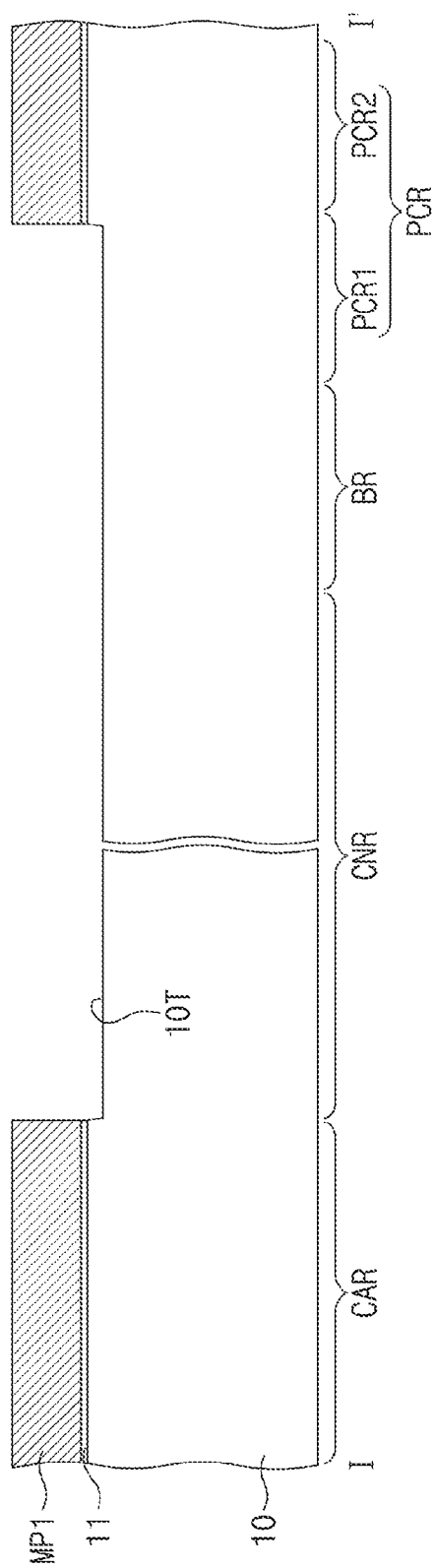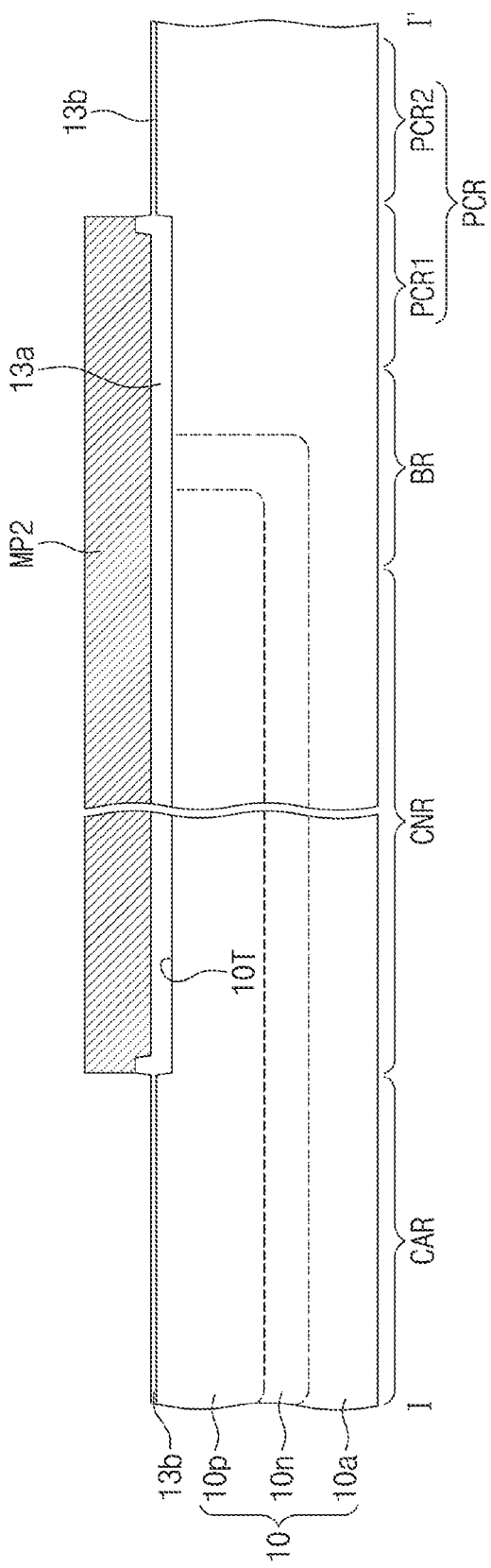

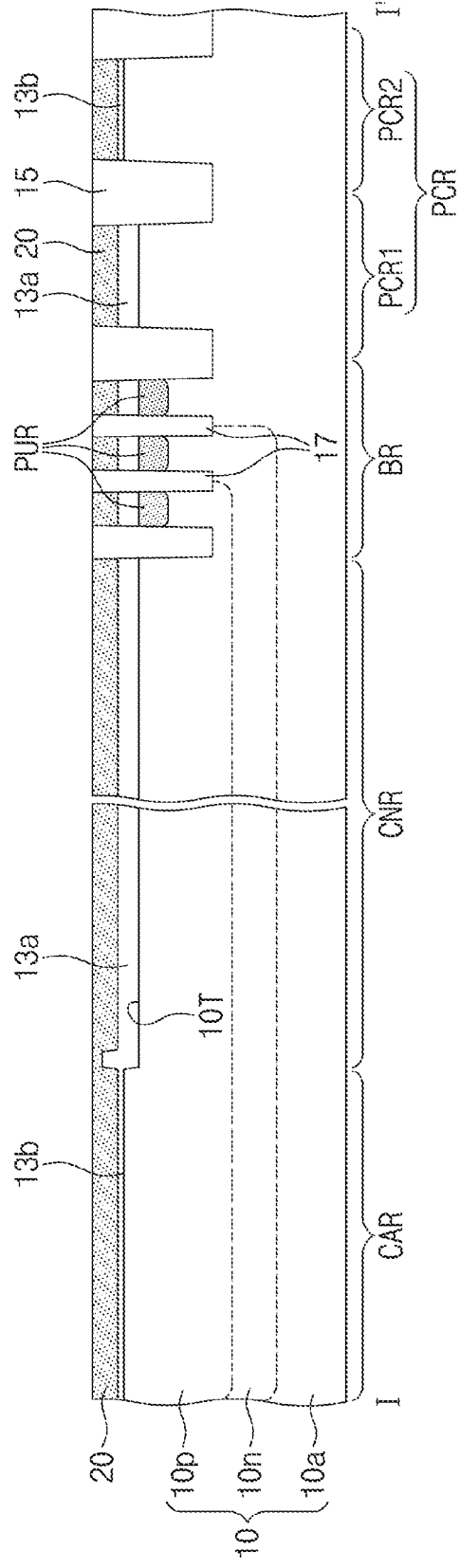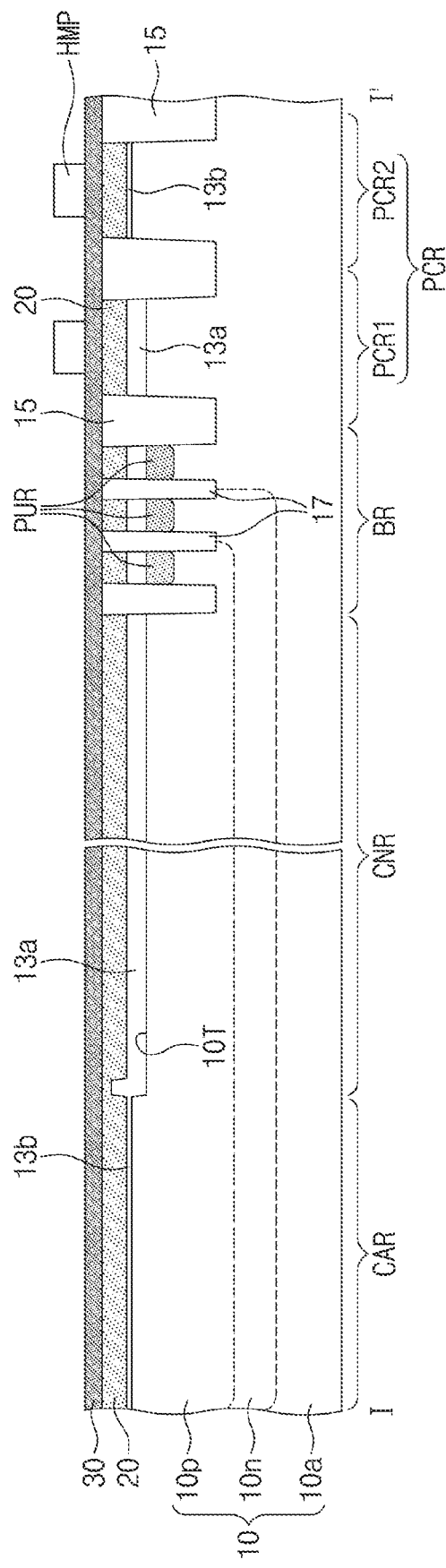

THREE-DIMENSIONAL SEMICONDUCTOR MEMORY DEVICES

CROSS-REFERENCE TO RELATED APPLICATION

This U.S. nonprovisional application claims priority under 35 U.S.C § 119 to Korean Patent Application No. 10-2018-0038582 filed on Apr. 3, 2018 in the Korean Intellectual Property Office, the entire contents of which are hereby incorporated by reference herein.

BACKGROUND

Inventive concepts relate to semiconductor memory devices, and more particularly, to three-dimensional semiconductor memory devices with enhanced reliability and integration.

Semiconductor devices have been highly integrated in order to provide high performance and low manufacturing cost associated with said semiconductor devices. Since integration of semiconductor memory devices is an important factor in determining product price of devices (e.g., electronic devices) that include one or more semiconductor memory devices, high integration of semiconductor memory devices is increasingly needed in particular. Integration of typical two-dimensional or planar semiconductor memory devices is primarily determined by the area occupied by a unit memory cell, such that it is greatly influenced by the level of technology for forming fine patterns. However, extremely expensive processing equipment is needed to increase pattern fineness such that the integration of the two-dimensional semiconductor memory devices is increasing but still limited.

SUMMARY

Some example embodiments provide three-dimensional semiconductor memory devices having three-dimensionally arranged (e.g., a three-dimensional configuration of) memory cells.

Some example embodiments of the inventive concepts provide a three-dimensional semiconductor memory device with enhanced reliability and integration.

An object of the inventive concepts is not limited to the mentioned above, and other objects which have not been mentioned above will be clearly understood to those skilled in the art from the following description.

According to some example embodiments of the inventive concepts, a three-dimensional semiconductor memory device may include a substrate including a cell array region, a peripheral circuit region, and a connection region between the cell array region and the peripheral circuit region. The memory device may include an electrode structure extending from the cell array region toward the connection region, the electrode structure including a plurality of electrodes stacked on a top surface of the substrate in a vertical direction substantially perpendicular to the top surface of the substrate. The memory device may include a horizontal gate dielectric layer between the electrode structure and the substrate. The horizontal gate dielectric layer may include a first portion and a second portion. The first portion of the horizontal gate dielectric layer may be on the cell array region of the substrate. The second portion of the horizontal gate dielectric layer may be on the connection region of the substrate. The second portion may be thicker than the first portion in the vertical direction. The memory device may include a plurality of first vertical channels on the cell array region of the substrate. The plurality of first vertical channels may penetrate the electrode structure and the first portion of the horizontal gate dielectric layer. The memory device may include a plurality of second vertical channels on the connection region of the substrate. The plurality of second vertical channels may penetrate the electrode structure and the second portion of the horizontal gate dielectric layer.

According to some example embodiments of the inventive concepts, a three-dimensional semiconductor memory device may include a substrate including a cell array region, a peripheral circuit region, a connection region adjacent in a first direction to the cell array region, and a dummy region adjacent in a second direction to the cell array region. The first and second directions may intersect each other and may be substantially parallel to a top surface of the substrate. The memory device may include an electrode structure including a plurality of electrodes stacked on the top surface of the substrate in a vertical direction substantially perpendicular to the top surface of the substrate. The memory device may include a horizontal gate dielectric layer between the electrode structure and the substrate. The horizontal gate dielectric layer may include a first portion on the cell array region and the dummy region. The first portion may have a first thickness in the vertical direction. The horizontal gate dielectric layer may include a second portion on the connection region. The second portion may have a second thickness in the vertical direction. The second thickness may be greater than the first thickness.

According to some example embodiments of the inventive concepts, a three-dimensional semiconductor memory device may include a substrate including a cell array region, a peripheral circuit region, and a connection region between the cell array region and the peripheral circuit region. The memory device may include an electrode structure extending from the cell array region toward the connection region. The electrode structure may include a plurality of electrodes stacked on a top surface of the substrate in a vertical direction substantially perpendicular to the top surface of the substrate. The memory device may include a horizontal gate dielectric layer between the electrode structure and the substrate. The horizontal gate dielectric layer may include a first portion and a second portion. The first portion of the horizontal gate dielectric layer may be on the cell array region of the substrate. The second portion of the horizontal gate dielectric layer may be on the connection region of the substrate. The second portion may be thicker than the first portion in the vertical direction. The memory device may include a first peripheral circuit region on the peripheral circuit region. The first peripheral circuit region may include a first gate dielectric layer and a first peripheral gate stack on the first gate dielectric layer. The memory device may include a second peripheral circuit region on the peripheral circuit region. The second peripheral circuit region may include a second gate dielectric layer and a second peripheral gate stack on the second gate dielectric layer. The second gate dielectric layer may be thinner than the first gate dielectric layer in the vertical direction. A thickness of the second portion of the horizontal gate dielectric layer in the vertical direction may be substantially equal to or greater than a thickness of the first gate dielectric layer in the vertical direction.

Details of some example embodiments are included in the description and drawings.

BRIEF DESCRIPTION OF THE DRAWINGS

FIGS. 10, 11, 12, 13, 14, 15, 16, 17, 18, and 19 illustrate cross-sectional views taken along line I-I' of FIG. 2, showing a method of fabricating a three-dimensional semiconductor memory device according to some example embodiments of the inventive concepts.

DETAILED DESCRIPTION

Some example embodiments of the inventive concepts will be described below in detail in conjunction with the accompanying drawings.

Figure 1:
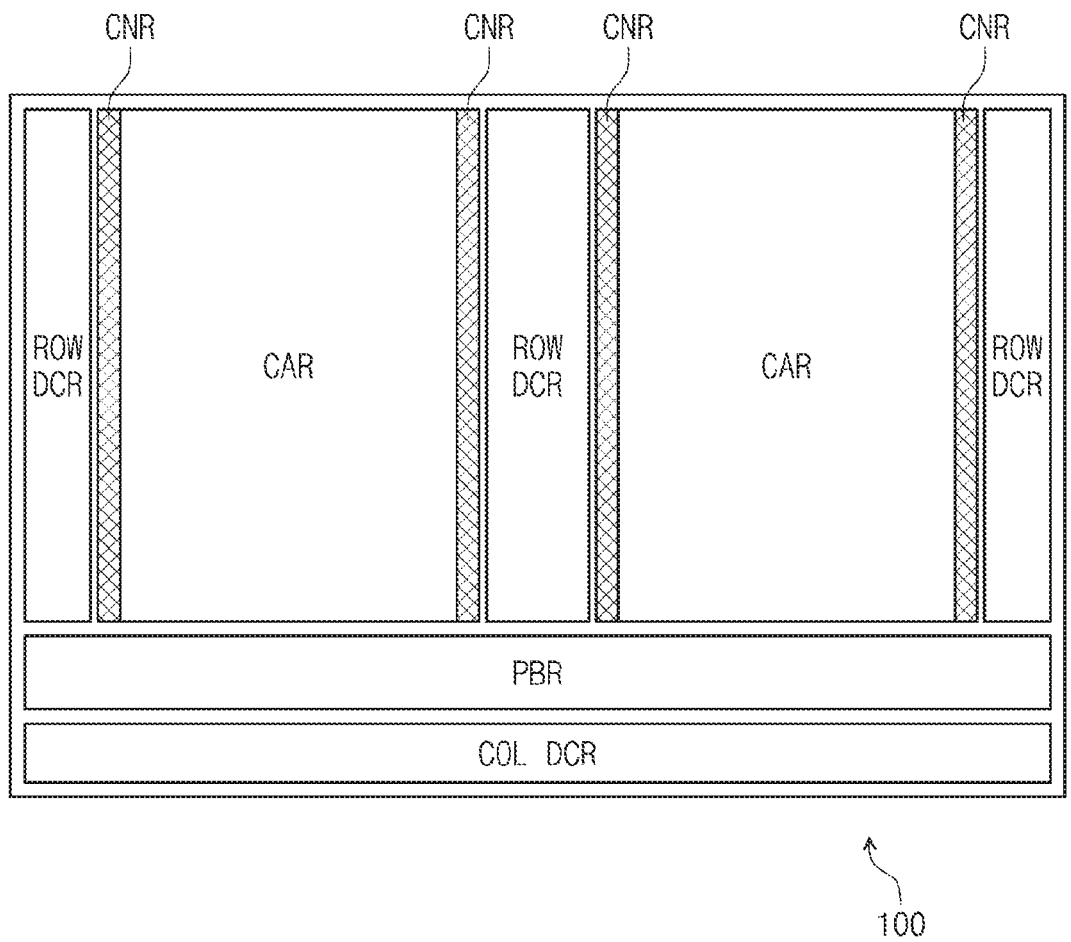
FIG. 1 illustrates a schematic diagram showing a simplified configuration of a three-dimensional semiconductor memory device 100 according to some example embodiments of the inventive concepts.

FIG. 1 illustrates a schematic diagram showing a simplified configuration of a three-dimensional semiconductor memory device 100 according to some example embodiments of the inventive concepts.

Referring to FIG. 1, a three-dimensional semiconductor memory device 100 may include a cell array region CAR and a peripheral circuit region. The peripheral circuit region may include row decoder regions ROW DCR, a page buffer region PBR, a column decoder region COL DCR, and a control circuit region (not shown). In some example embodiments, a connection region CNR may be disposed between the cell array region CAR and the row decoder region ROW DCR.

The cell array region CAR may include a memory cell array consisting of a plurality of memory cells. In some example embodiments, the memory cell array may include a plurality of memory blocks as data erase units. Each of the memory blocks may include three-dimensionally arranged memory cells, a plurality of word lines electrically connected to the memory cells, and a plurality of bit lines electrically connected to the memory cells.

The three-dimensional semiconductor memory device 100 may be a vertical NAND Flash memory device, and the cell array region CAR may be provided with cell strings that are two-dimensionally arranged along first and second directions intersecting each other and extend in a third direction perpendicular to the first and second directions. Each of the cell strings may include string select transistors, memory cell transistors, and a ground select transistor that are connected in series. Each of the memory cell transistors may include a data storage element.

The row decoder region ROW DCR may be provided with a row decoder that selects the word lines of the memory cell array, and the connection region CNR may be provided with a routing structure that electrically connects the memory cell array to the row decoder. The row decoder may select one of the word lines of the memory cell array in accordance with address information. The row decoder may provide word line voltages to the selected word line and unselected word lines in response to a control signal from a control circuit.

The page buffer region PBR may be provided with a page buffer that reads data stored in the memory cells. Depending on an operating mode, the page buffer may temporarily store data to be stored in the memory cells or may sense data stored in the memory cells. The page buffer may function as a write driver circuit in a program operating mode and as a sense amplifier circuit in a read operating mode.

The column decoder region COL DCR may be provided with a column decoder connected to the bit lines of the memory cell array. The column decoder may provide a data transmission path between the page buffer and an external device (e.g., a memory controller).

Figure 2:
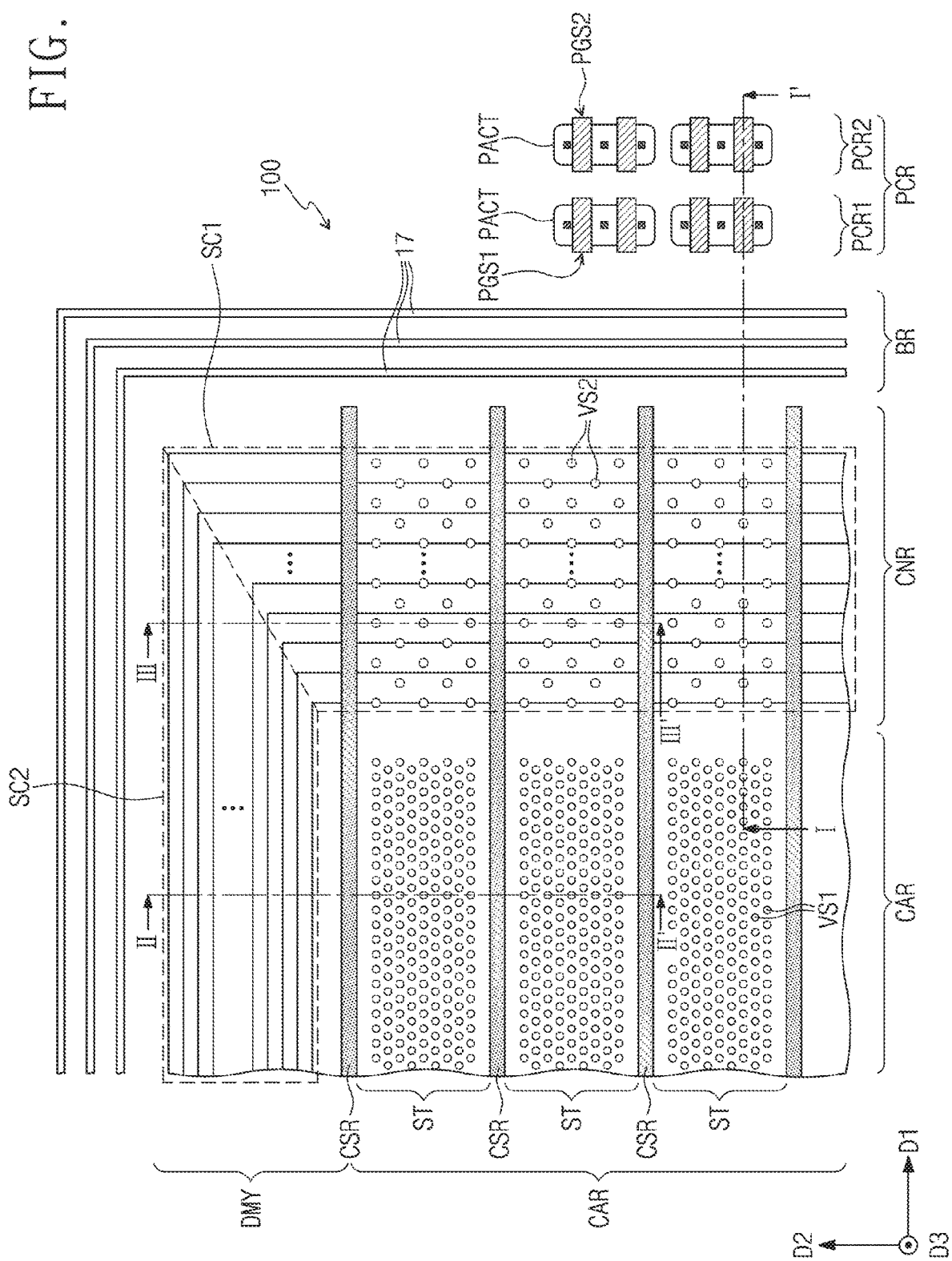
FIG. 2 illustrates a plan view showing a three-dimensional semiconductor memory device according to some example embodiments of the inventive concepts.
Figure 3:
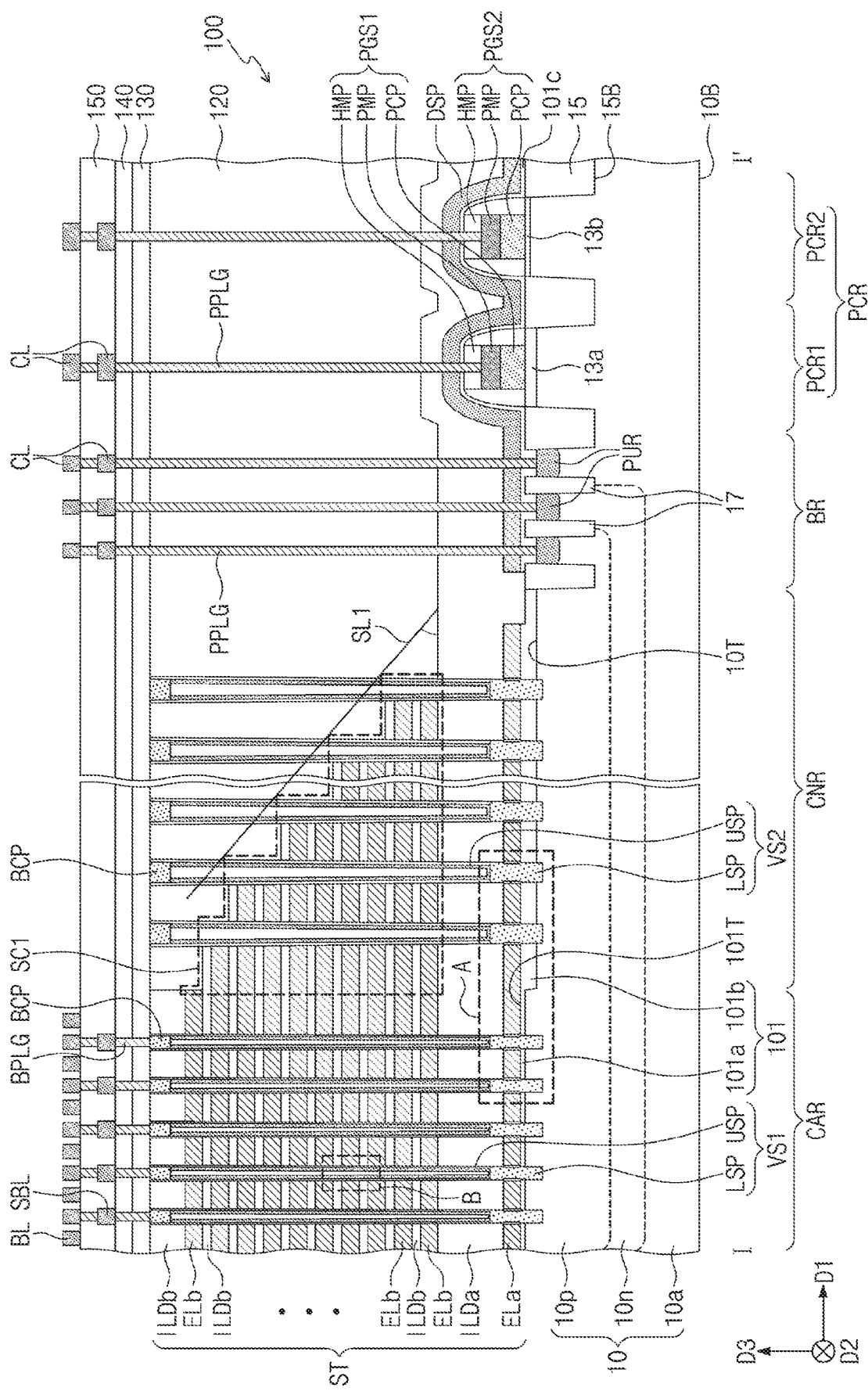
FIGS. 3, 4, and 5 illustrate cross sectional views respectively taken along lines I-I', II-II', and III-III' of FIG. 2, showing a three-dimensional semiconductor memory device according to some example embodiments of the inventive concepts.
Figure 4:
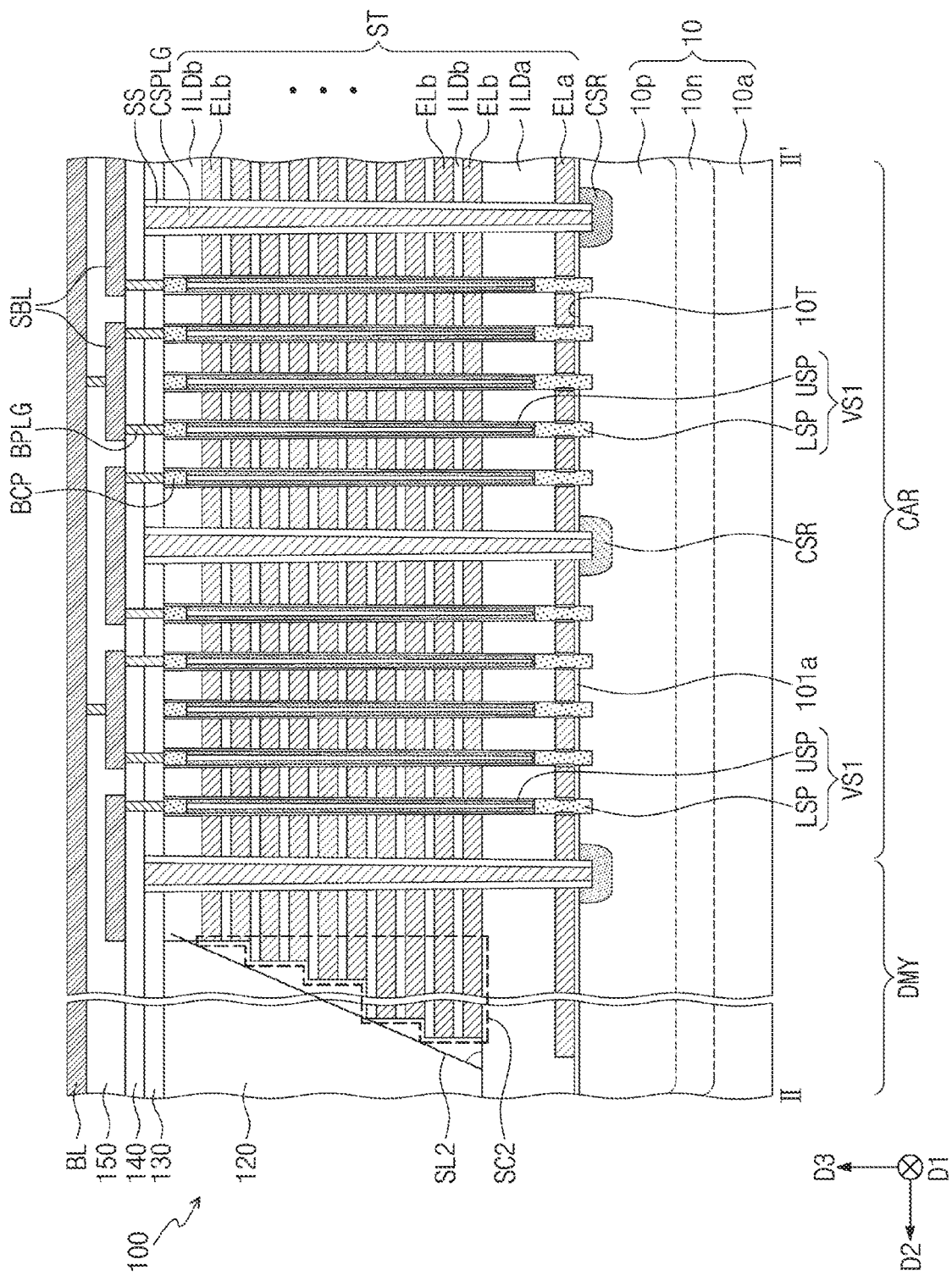
Figure 5:
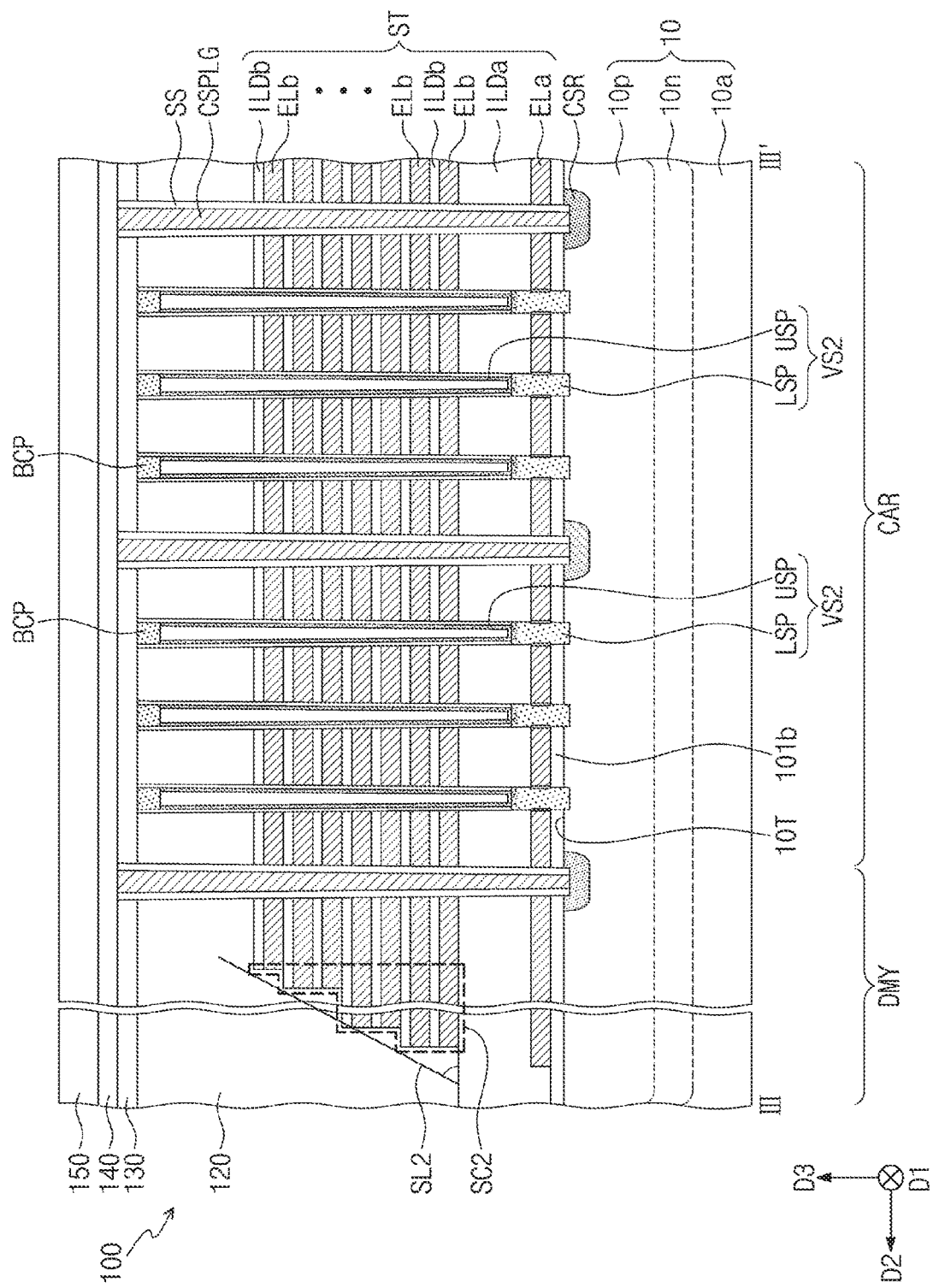
Figure 6A:
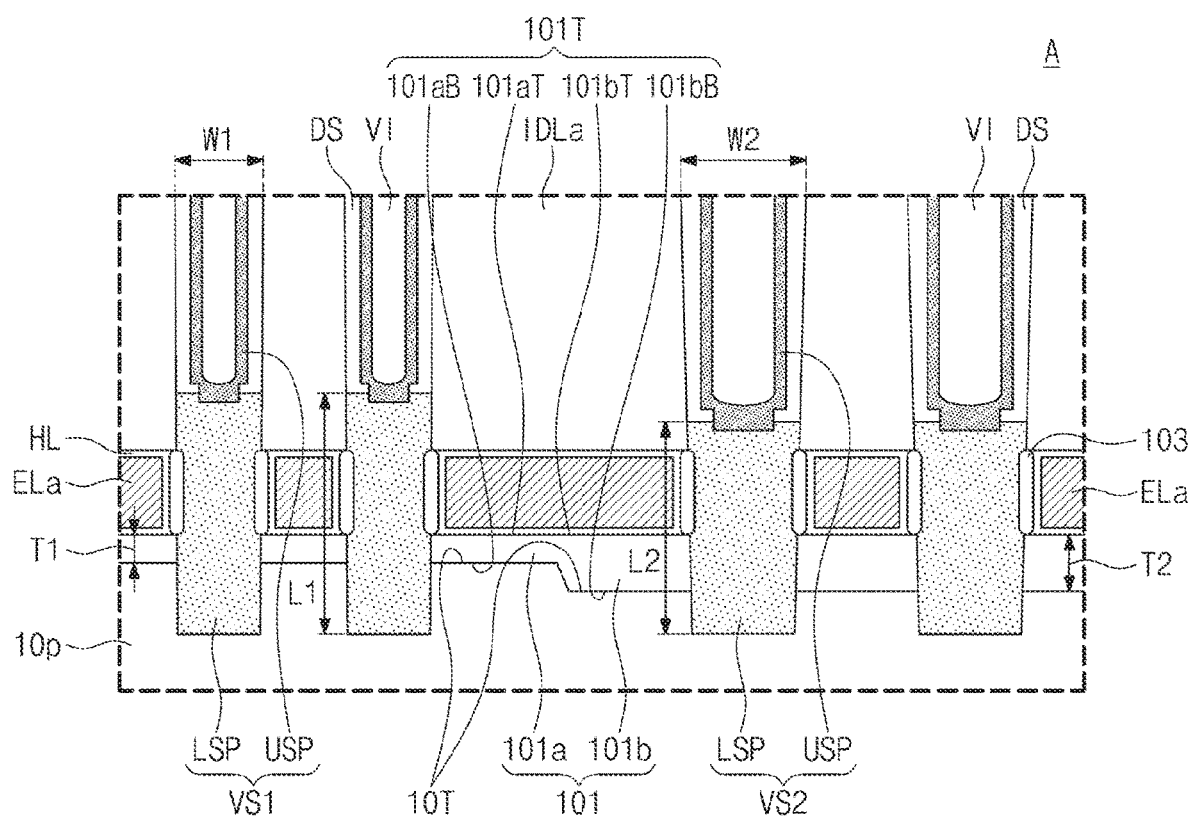
FIGS. 6A, 6B, 6C, 6D, and 6E illustrate enlarged views showing section A of FIG. 3.

FIG. 2 illustrates a plan view showing a three-dimensional semiconductor memory device 100 according to some example embodiments of the inventive concepts. FIGS. 3, 4, and 5 illustrate cross sectional views respectively taken along lines I-I', II-II', and III-III' of FIG. 2, showing a three-dimensional semiconductor memory device 100 according to some example embodiments of the inventive concepts. FIGS. 6A, 6B, 6C, 6D, and 6E illustrate enlarged views showing section A of FIG. 3. FIG. 6F illustrates an enlarged view showing section B of FIG. 3.

Referring to FIGS. 2, 3, 4, and 5, a substrate 10 may include a cell array region CAR, a connection region CNR, a dummy region DMY, and a peripheral circuit region PCR, and said regions may be referred to as respective regions of the substrate 10. The connection region CNR and the cell array region CAR may be adjacent to each other in a first direction D1 parallel to a top surface 10T of the substrate 10, which connection region CNR is between the cell array region CAR and the peripheral circuit region PCR. The dummy region DMY and the cell array region CAR may be adjacent to each other in a second direction D2 that is parallel or substantially parallel (e.g., parallel within manufacturing tolerances and/or material tolerances) to the top surface 10T of the substrate 10 and intersects the first direction D1. The peripheral circuit region PCR may include a first peripheral circuit region PCR1 and a second peripheral circuit region PCR2, and the first peripheral circuit region PCR1, and thus the first peripheral gate stack PGS1, may be closer than the second peripheral circuit region PCR2, and thus the second peripheral gate stack PGS2, to the cell array region CAR, and thus to one or more electrode structures ST of the electrode structures ST. The substrate 10 may further include a boundary region BR between the peripheral circuit region PCR and the connection region CNR.

The substrate 10 may be one of a material having semiconductor characteristics (e.g., silicon wafer), an insulating material (e.g., glass), a semiconductor or conductor covered with an insulating material. For example, the substrate 10 may be a silicon wafer having a first conductivity.

The substrate 10 may include a first well impurity layer 10n on a lower substrate portion 10a, the first well impurity layer 10n having a second conductivity and a second well impurity layer 10p having the first conductivity in the first well impurity layer 10n. The first well impurity layer 10n may be provided on the cell array region CAR, the connection region CNR, and the dummy region DMY. The second well impurity layer 10p may be provided on the cell array region CAR, the connection region CNR, the dummy region DMY, and the boundary region BR.

The substrate 10 on the peripheral circuit region PCR may be provided therein with a device isolation layer 15 defining peripheral active areas PACT. Guard ring insulating patterns 17 may be disposed in the substrate 10 on the boundary region BR, and may have a ring shape surrounding the cell array region CAR. The guard ring insulating patterns 17 may be provided on boundaries between the first and second well impurity layers 10n and 10p. Pick-up impurity regions PUR may be provided in the substrate 10 on the boundary region BR, and spaced apart from each other across the guard ring insulating pattern 17. The pick-up impurity regions PUR may be provided in the substrate 10, the first well impurity layer 10n, and the second well impurity layer 10p.

The substrate 10 on the peripheral circuit region PCR may be provided thereon with peripheral logic circuits that write data into and read data from memory cells. The peripheral logic circuits may include row and column decoders, a page buffer, and control circuits. The peripheral logic circuits may include, for example, a high-voltage or low-voltage transistor, a resistor, and a capacitor. In some example embodiments, the high-voltage transistor may be provided on the substrate 10 of the first peripheral circuit region PCR1, and the low-voltage transistor may be provided on the substrate 10 of the second peripheral circuit region PCR2. The high-voltage transistor may be closer than the low-voltage transistor to the cell array region CAR.

A first peripheral gate stack PGS1 may be provided on the first peripheral circuit region PCR1, and a second peripheral gate stack PGS2 may be provided on the second peripheral circuit region PCR2. The first and second peripheral gate stacks PGS1 and PGS2 may run ("extend") across the peripheral active areas PACT. Each of the first and second peripheral gate stacks PGS1 and PGS2 may include a gate conductive pattern PCP, a gate metal pattern PMP, and a peripheral hardmask pattern HMP.

A first gate dielectric layer 13a may be disposed between the first peripheral gate stack PGS1 and the substrate 10 of the first peripheral circuit region PCR1, and a second gate dielectric layer 13b may be disposed between the second peripheral gate stack PGS2 and the substrate 10 of the second peripheral circuit region PCR2. Accordingly, the first peripheral circuit region PCR1 will be understood to include the first gate dielectric layer 13a and a first peripheral gate stack PGS1 that is on (e.g., stacked on) the first gate dielectric layer 13a, and the second peripheral circuit region PCR2 will be understood to include the second gate dielectric layer 13b and a second peripheral gate stack PGS2 that is on (e.g., stacked on) the second gate dielectric layer 13b. The first gate dielectric layer 13a may be thicker than the second gate dielectric layer 13b in the third direction D3, and the first and second gate dielectric layers 13a and 13b may have top surfaces at substantially the same level (e.g., the same level within manufacturing tolerances and/or material tolerances).

Gate spacers may cover opposite sidewalls of each of the first and second peripheral gate stacks PGS1 and PGS2. Source/drain impurity sections may be provided in the peripheral active area PACT on opposite sides of each of the first and second peripheral gate stacks PGS1 and PGS2.

As shown in at least FIGS. 3-5, a horizontal gate dielectric layer 101 may cover the top surface 10T of the substrate 10 on the cell array region CAR, the connection region CNR, and the dummy region DMY. The horizontal gate dielectric layer 101 may include a silicon oxide layer or a silicon oxynitride layer.

The horizontal gate dielectric layer 101 may include a first portion 101a covering the top surface 10T of the substrate 10 both on the cell array region CAR and on the dummy region DMY, and also include a second portion 101b covering the top surface 10T of the substrate 10 on the connection region CNR. Referring to FIG. 6A, the first portion 101a of the horizontal gate dielectric layer 101 may have a first thickness T1, and the second portion 101b of the horizontal gate dielectric layer 101 may have a second thickness T2 greater than the first thickness T1. The second thickness T2 of the second portion 101b of the horizontal gate dielectric layer 101 in the third direction D3 may be substantially equal to (e.g., equal to within manufacturing tolerances and/or material tolerances) or greater than a thickness of the first gate dielectric layer 13a in the third direction D3 on the first peripheral circuit region PCR1. The first thickness T1 and the second thickness T2 are each thicknesses in direction D3, where direction D3 extends perpendicularly or substantially perpendicularly (e.g., perpendicularly within manufacturing tolerances and/or material tolerances) in relation to the top surface 10T of the substrate 10. Accordingly, the second portion 101b of the horizontal gate dielectric layer 101 may be thicker than the first portion 101a in direction D3.

As shown in at least FIGS. 3-5, the horizontal gate dielectric layer 101 may have a flat or substantially flat (e.g., flat within manufacturing tolerances and/or material tolerances) top surface 101T on at least the cell array region CAR, the dummy region DMY, and the connection region CNR. For example, as shown in at least FIG. 6A, the horizontal gate dielectric layer 101 may be configured such that the first portion 101a may have a top surface 101aT coplanar or substantially coplanar (e.g., coplanar within manufacturing tolerances and/or material tolerances) with the top surface 101bT of the second portion 101b. As further shown in at least FIG. 6A, the second portion 101b may have a bottom surface 101bB lower than (e.g., proximate to a bottom surface 10B of substrate 10 in relation to) the bottom surface 101aB of the first portion 101a and higher than (e.g., distal to the bottom surface 10B of substrate 10 in relation to) the bottom surface 15B of the device isolation layer 15. The second portion 101b of the horizontal gate dielectric layer 101 may extend from the connection region CNR toward the boundary region BR. As used herein, a "flat" surface such as top surface 101T may be understood to have a fixed position in the third direction D3.

In some example embodiments, a plurality of electrode structures ST may be disposed on the horizontal gate dielectric layer 101 and thus, as shown in FIGS. 2-5, may be stacked on the substrate 10. Accordingly, as shown in at least FIGS. 3-5, the horizontal gate dielectric layer 101 may be between one or more of the electrode structures ST and the substrate 10. Each of the electrode structures ST may extend along the first direction D1 from the cell array region CAR toward the connection region CNR, and may be spaced apart from each other in the second direction D2 intersecting the first direction D1.

Each of the electrode structures ST may include electrodes ELa and ELb (which may be collectively referred to as a plurality of electrodes) and interlayer dielectric layers ILDa and ILDb that are alternately stacked along a third direction D3 (also referred to herein as a "vertical direction") that is perpendicular or substantially perpendicular (e.g., perpendicular within manufacturing tolerances and/or material tolerances) to the top surface 10T of the substrate 10. Restated, each interlayer dielectric layer ILDa and/or ILDb may be between a separate pair of adjacent electrodes ELb and/or Ela in the third direction D3. It will be understood that the plurality of electrodes (e.g., ELa and ELb) of an electrode structure ST may be stacked on the top surface 10T of the substrate 10 in the "vertical direction" D3. The electrode structures ST may have, on the connection region CNR, a first staircase structure SC1 along the first direction D1, and may also have, on the dummy region DMY, a second staircase structure along the second direction D2. As referred to herein, the "staircase structure" of the electrode structures will be understood to refer to a structure and/or portion of a structure (e.g., an electrode structure ST) of elements (e.g., electrodes ELb) having different dimensions (e.g., lengths) in one or more directions that are perpendicular or substantially perpendicular to the "vertical direction" D3 (e.g., the first and/or second directions D1 and/or D2) and wherein elements of the structure have lengths in the one or more directions that vary in inverse proportion with distance in the third direction D3 from the bottom surface 10B of the substrate 10 (e.g., electrodes ELb that are distal from the bottom surface 10B have a smaller length in directions D1 and/or D2 than electrodes ELb that are proximate to the bottom surface 10B). As a result, and as shown in at least FIGS. 3-5, a height of the staircase structure in the third direction D3 is staggered in the first direction D1 and/or second direction D2.

For example, as shown in at least FIG. 3, a portion of an electrode structure ST may include a first staircase structure SC1 based on electrodes ELb having respective lengths in the first direction D1 that decrease with increasing distance, in the third direction D3, of said respective electrodes ELb of the electrode structure ST from the bottom surface 10B, such that the portion of the staircase structure SC1 has a height in the third direction D3 that is staggered in the first direction D1, thereby providing a staggered (or "staircase") shape of the portion of the electrode structure ST in the first and third directions D1 and D3.

In another example, as shown in at least FIGS. 4-5, a portion of an electrode structure ST may include a second staircase structure SC2 based on electrodes ELb having respective lengths in the second direction D2 that decrease with increasing distance, in the third direction D3, of said respective electrodes ELb of the electrode structure ST from the bottom surface 10B, such that the portion of the electrode structure ST has a height in the third direction D3 that is staggered in the second direction D2, thereby providing a staggered (or "staircase") shape of the portion of the electrode structure ST in the second and third directions D2 and D3.

As shown in FIGS. 3-5, the second staircase structure SC2 may have a slope SL2 different from the slope SL1 of the first staircase structure SC1, where the "slope" of a staircase structure (e.g., SL1 and SL2) refers to the slope defined by the variable-sized electrodes ELb comprising the staircase structure. For example, the slope SL2 of the second staircase structure SC2 may be greater than the slope SL1 of the first staircase structure SC1. In some example embodiments, when viewed in plan, the first staircase structure SC1 of the electrode structures ST may partially, entirely, and/or exclusively overlap the second portion 101b of the horizontal gate dielectric layer 101 in the third direction D3, and the second staircase structure SC2 of the electrode structures ST may partially, entirely, and/or exclusively overlap the first portion 101a of the horizontal gate dielectric layer 101 in the third direction D3.

As shown in FIG. 3, the first staircase structure SC1 of the electrode structure ST may be understood to "descend" from the connection region CNR towards the peripheral circuit region PCR (e.g., the slope SL1 of the first staircase structure SC1 extends downwards (e.g., closer to the bottom surface 10B) with closer proximity to the peripheral circuit region PCR).

As shown in FIGS. 4-5, the second staircase structure SC2 of the electrode structure ST may be understood to "descend" from the cell array region CAR towards the dummy region DMY (e.g., the slope SL2 of the second staircase structure SC2 extends downwards (e.g., closer to the bottom surface 10B) with closer proximity to the dummy region DMY). It will be understood, as shown in FIGS. 3-5, that the "staircase structure" (e.g., SC1 and/or SC2) of an electrode structure ST may refer to a limited portion of the electrode structure ST that has a staggered height (e.g., in the third direction D3) and/or staggered width (e.g., in the first and/or second directions D1 and/or D2).

In some example embodiments, the electrodes ELa and ELb may include a lower electrode ELa that is a lowermost one electrode of the electrodes ELa and ELb and is adjacent to the horizontal gate dielectric layer 101, and also include a plurality of upper electrodes ELb vertically stacked on the lower electrode ELa. The lower electrode ELa and the upper electrodes ELb may include, for example, at least one selected from doped semiconductor (e.g., doped silicon), metal (e.g., tungsten, copper, or aluminum), conductive metal nitride (e.g., titanium nitride or tantalum nitride), and transition metal (e.g., titanium or tantalum).

The interlayer dielectric layers ILDa and ILDb may include a lower interlayer dielectric layer ILDa that covers the lower electrode ELa and continuously extends from the cell array region CAR toward the peripheral circuit region PCR, and also include upper interlayer dielectric layers ILDb disposed between the upper electrodes ELb. The lower interlayer dielectric layer ILDa may include an insulating material the same as or different from those of the upper interlayer dielectric layers ILDb. For example, the lower interlayer dielectric layer ILDa may include an HDP oxide layer, and the upper interlayer dielectric layers ILDb may include a TEOS layer.

In some example embodiments, the lower electrode ELa may have a thickness substantially the same (e.g., the same within manufacturing tolerances and/or material tolerances) as those of the upper electrodes ELb. The lower interlayer dielectric layer ILDa may be thicker than the upper interlayer dielectric layers ILDb. On the peripheral circuit region PCR, the lower interlayer dielectric layer ILDa may include protruding portions that protrude convexly upward to cover the first and second peripheral gate stacks PGS1 and PGS2, such that the lower interlayer dielectric layer ILDa covers the first and second peripheral gate stacks PGS1 and PGS2. An uppermost one of the upper interlayer dielectric layers ILDb may be thicker than other upper interlayer dielectric layers ILDb.

On the boundary region BR and the peripheral circuit region PCR, a dummy sacrificial pattern DSP may conformally cover the substrate 10 and the first and second peripheral gate stacks PGS1 and PGS2. The dummy sacrificial pattern DSP may have a thickness less than those of the first and second peripheral gate stacks PGS1 and PGS2. For example, the dummy sacrificial pattern DSP may include a silicon nitride layer.

A dummy gate dielectric layer 101c may be disposed between the dummy sacrificial pattern DSP and the first and second peripheral gate stacks PGS1 and PGS2. On the peripheral circuit region PCR, the dummy gate dielectric layer 101c may conformally cover the first and second peripheral gate stacks PGS1 and PGS2. The dummy gate dielectric layer 101c may include an insulating material the same as that of the horizontal gate dielectric layer 101.

The substrate 10 may be provided on its entire surface with a planarized insulating layer 120 covering the lower interlayer dielectric layer ILDa on the peripheral circuit region PCR and the electrode structures ST. The planarized insulating layer 120 may have a substantially flat (e.g., flat within manufacturing tolerances and/or material tolerances) top surface and a maximum thickness on the peripheral circuit region PCR. The planarized insulating layer 120 may include an insulating material different from that of the lower interlayer dielectric layer ILDa. For example, the lower interlayer dielectric layer ILDa may include an HDP oxide layer, and the planarized insulating layer 120 may include a tetraethylorthosilicate (TEOS) layer.

The cell array region CAR may be provided thereon with a plurality of first vertical channels VS1 that are on the cell array region CAR of the substrate 10, where each first vertical channel VS1 of the plurality of first vertical channels VS1 penetrate both the electrode structures ST and the first portion 101a of the horizontal gate dielectric layer 101, and the connection region CNR may be provided thereon with a plurality of second vertical channels VS2 that are on the connection region CNR of the substrate 10, where each second vertical channel VS2 of the plurality of second vertical channels VS2 penetrate the planarized insulating layer 120, the electrode structures ST, and the second portion 101b of the horizontal gate dielectric layer 101.

Referring to FIGS. 2 and 6A, each first vertical channel VS1 of the first vertical channels VS1 may have a circular top surface and a first width W1. Each second vertical channel VS2 of the second vertical channels VS2 may have a second width W2, where the second width W2 is greater than the first width W1 of each first vertical channel VS1 of the first vertical channels VS1. Each second vertical channel VS2 of the second vertical channels VS2 may have a substantially circular shape (e.g., a circular shape within manufacturing tolerances and/or material tolerances), or may have an elliptical or bar shape. The second vertical channels VS2 may penetrate the first staircase structure SC1 of the electrode structures ST. The first and second vertical channels VS1 and VS2 may have the same length in the third direction D3 and may be connected to the substrate 10.

Each of the first and second vertical channels VS1 and VS2 may include a lower semiconductor pattern LSP and an upper semiconductor pattern USP on the lower semiconductor pattern LSP. For example, as shown in FIG. 6A, the lower semiconductor pattern LSP may be an epitaxial layer and/or epitaxial pattern that is epitaxially grown from the substrate 10. The lower semiconductor pattern LSP may have a pillar shape that penetrates the lower electrode Ela, which may itself be referred to as a lowermost one electrode of the plurality of electrodes (e.g., ELa and ELb) of at least one electrode structure ST of the plurality of electrode structures ST, and may be connected ("coupled") to the substrate 10. The lower semiconductor pattern LSP may be formed of ("may at least partially comprise"), but not limited to, single crystalline silicon or polycrystalline silicon. For example, the lower semiconductor pattern LSP may be formed of carbon nanostructures, organic semiconductor materials, and/or compound semiconductors. A vertical gate dielectric layer 103 may be disposed between the lower electrode ELa and a sidewall of the lower semiconductor pattern LSP.

Referring to FIG. 6A, the upper semiconductor pattern USP may be coupled to the lower semiconductor pattern LSP (e.g., the upper semiconductor pattern USP may be a "semiconductor pattern" that is on the lower semiconductor pattern LSP) and may have a macaroni or pipe shape whose bottom end is closed. A buried insulating pattern VI may fill an inside of the upper semiconductor pattern USP shaped as discussed above. The upper semiconductor pattern USP may include silicon (Si), germanium (Ge), or a mixture thereof. The upper semiconductor pattern USP may have a single crystalline structure, an amorphous structure, a polycrystalline structure, or a combination thereof. The upper semiconductor pattern USP may be provided on its top end with a bit line conductive pad BCP, which is an impurity-doped region or consists of a conductive material. In some example embodiments, the lower semiconductor pattern LSP is understood to be an epitaxial pattern that penetrates a lowermost one electrode (e.g., ELa) of the plurality of electrodes (e.g., ELa and ELb) and is coupled to the substrate 10, and the upper semiconductor pattern USP is understood to extend along the third direction D3 ("vertically extends") on the epitaxial pattern.

It will be understood that an element that is "on" another element may be "above" or "below" the other element. Additionally, an element that is on another element may be "directly on" (e.g., in contact with) the other element or may be "indirectly on" the other element, such that the element is isolated from direct contact with the other element by one or more interposing elements and/or spaces.

In some example embodiments, and as shown in at least FIGS. 3-6E, the lower semiconductor patterns LSP of the first and second vertical channels VS1 and VS2 may have top surfaces higher than that of the lower electrode ELa. The top surfaces of the lower semiconductor patterns LSP may be positioned between the top surface of the lower electrode ELa and a top surface of a lowermost one of the upper electrodes ELb. As shown in at least FIG. 6A, the lower semiconductor patterns LSP of the first vertical channels VS1 may have respective lengths L1 that are greater than the respective lengths L2 of the lower semiconductor patterns LSP of the second vertical channels VS2. For example, and as shown in at least FIG. 6C, the top surfaces LSPT2 of the lower semiconductor patterns LSP included in the second vertical channels VS2 may be lower than (e.g., proximate to the bottom surface 10B of the substrate 10 in relation to) the top surfaces LSPT1 of the lower semiconductor patterns LSP included in the first vertical channels VS1.

Figure 6B:
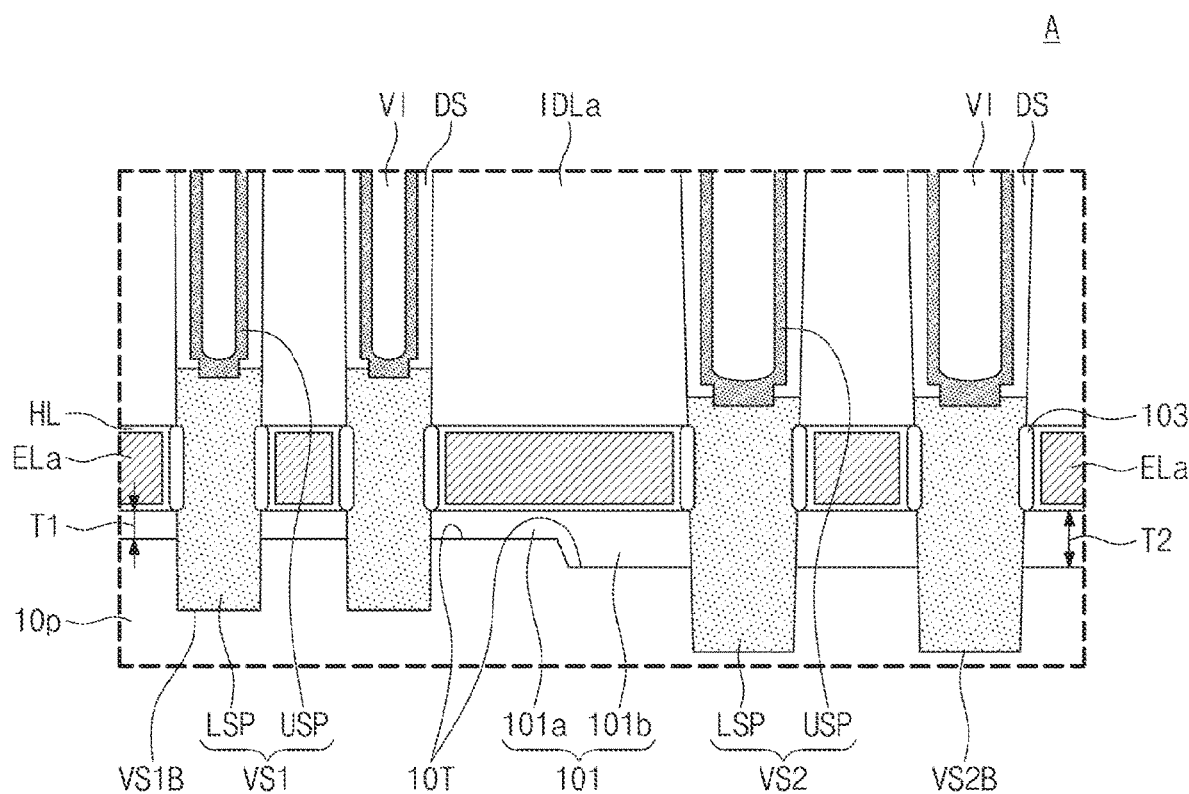

Referring to FIG. 6B, the second vertical channels VS2 may have respective bottom surfaces VS2B lower than (e.g., proximate to the bottom surface 10B of the substrate 10 in relation to) the respective bottom surfaces VS1B of the first vertical channels VS1. The lower semiconductor patterns LSP included in the second vertical channels VS2 may have bottom surfaces lower than those of the lower semiconductor patterns LSP included in the first vertical channels VS1. In addition, the top surfaces of the lower semiconductor patterns LSP included in the second vertical channels VS2 may be lower than the top surfaces of the lower semiconductor patterns LSP included in the first vertical channels VS1.

Figure 6C:
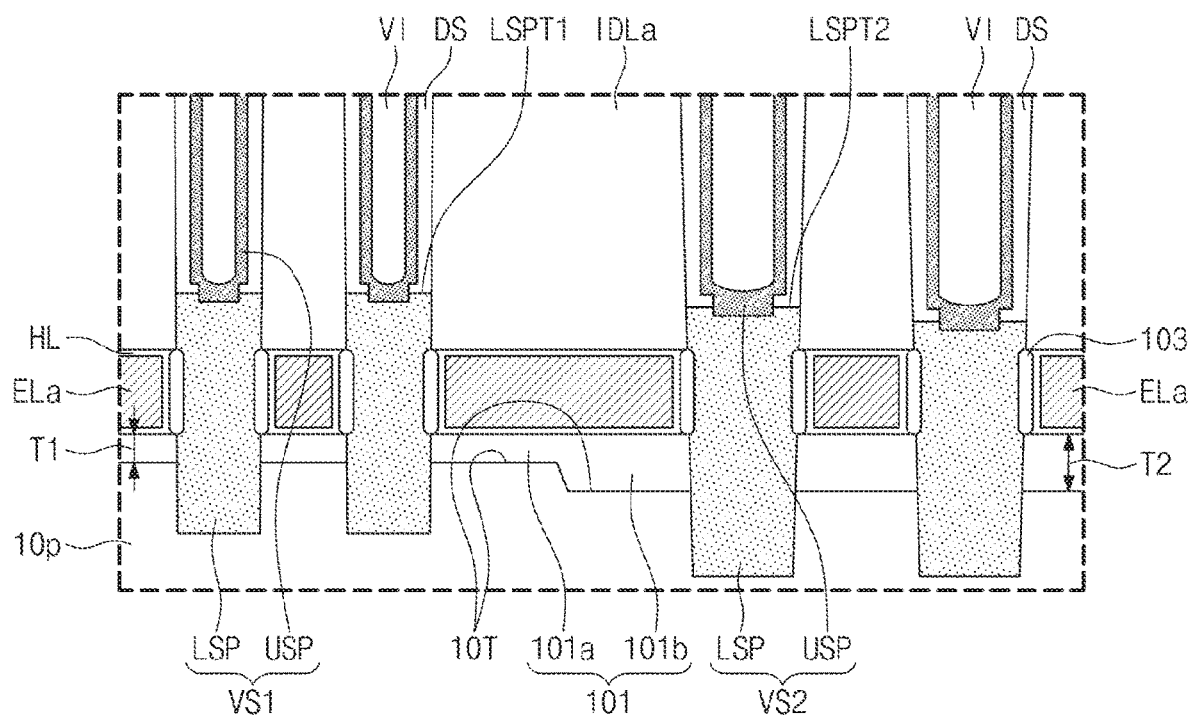

Referring to FIG. 6C, the top surfaces of the lower semiconductor patterns LSP included in the second vertical channels VS2 may be positioned at different levels. The lower semiconductor patterns LSP of the second vertical channels VS2 may have different lengths from each other. For example, the top surfaces of the lower semiconductor patterns LSP included in the second vertical channels VS2 may become lowered as the second vertical channels VS2 become farther away from the cell array region CAR. For example, the lengths of the lower semiconductor patterns LSP included in the second vertical channels VS2 may become shorter as the second vertical channels VS2 become farther away from the cell array region CAR.

Figure 6D:
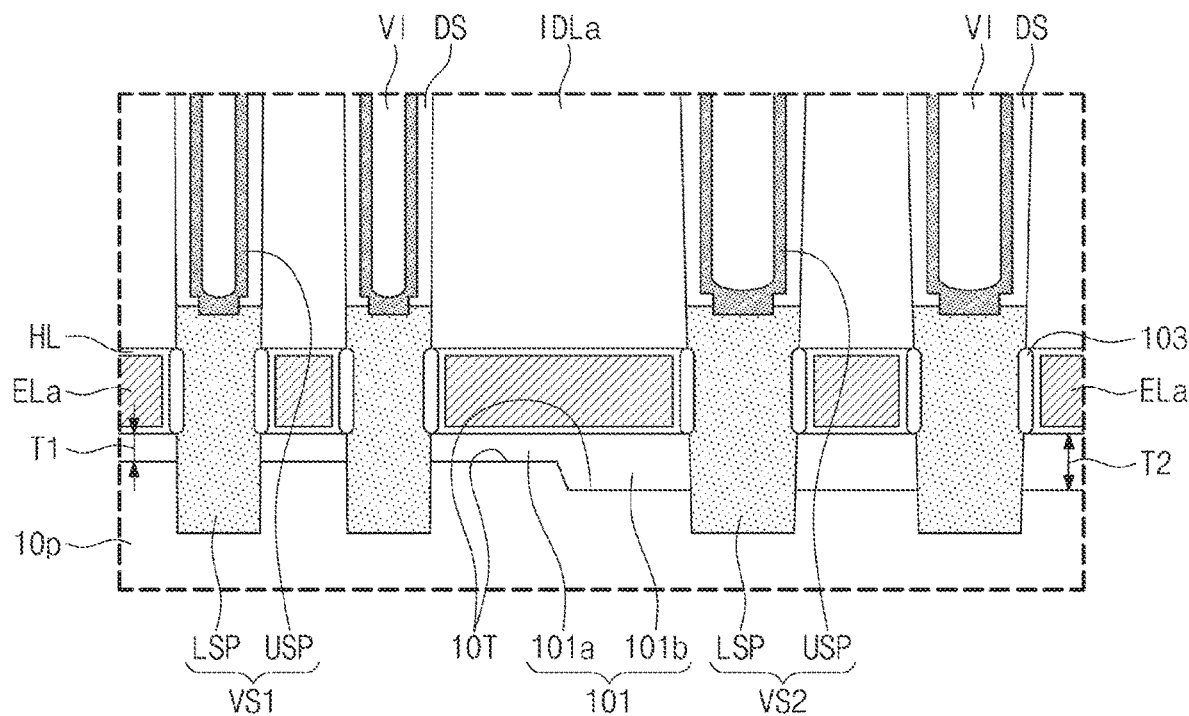

Referring to FIG. 6D, the lower semiconductor patterns LSP of the first and second vertical channels VS1 and VS2 may have substantially the same length (e.g., the same length within manufacturing tolerances and/or material tolerances). The lower semiconductor patterns LSP of the first and second vertical channels VS1 and VS2 may have bottom surfaces at substantially the same level (e.g., at the same level within manufacturing tolerances and/or material tolerances) and top surfaces at substantially the same level.

Figure 6E:
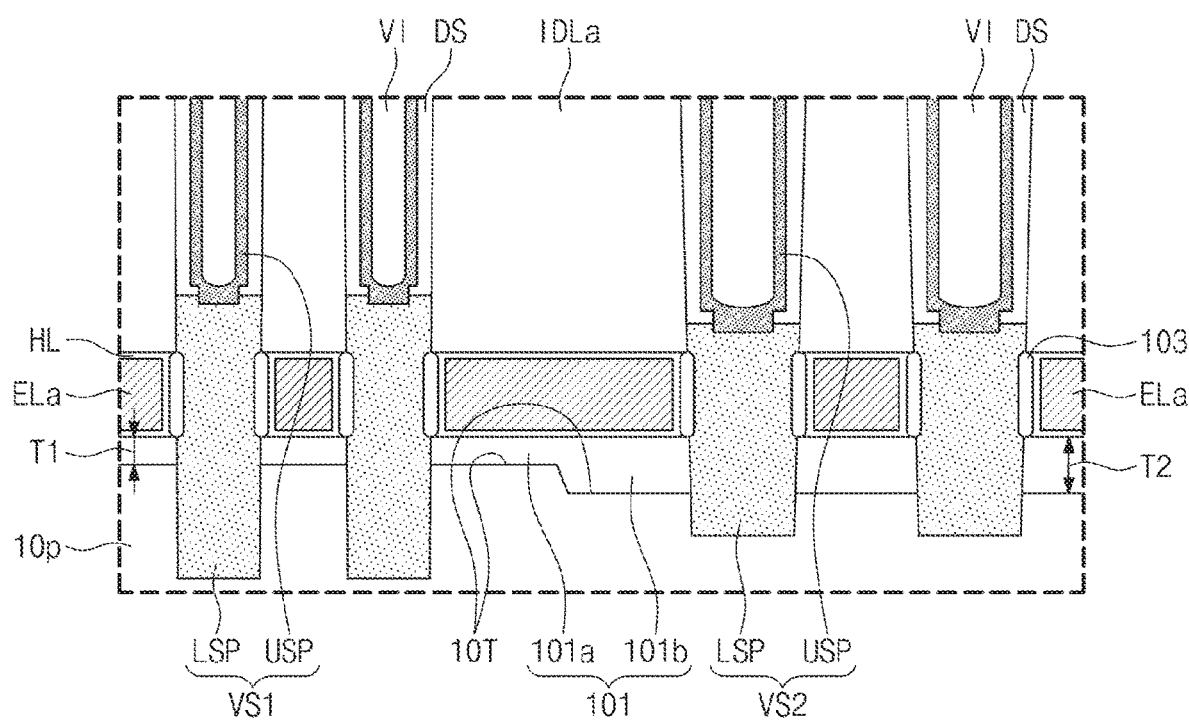
Figure 6F:
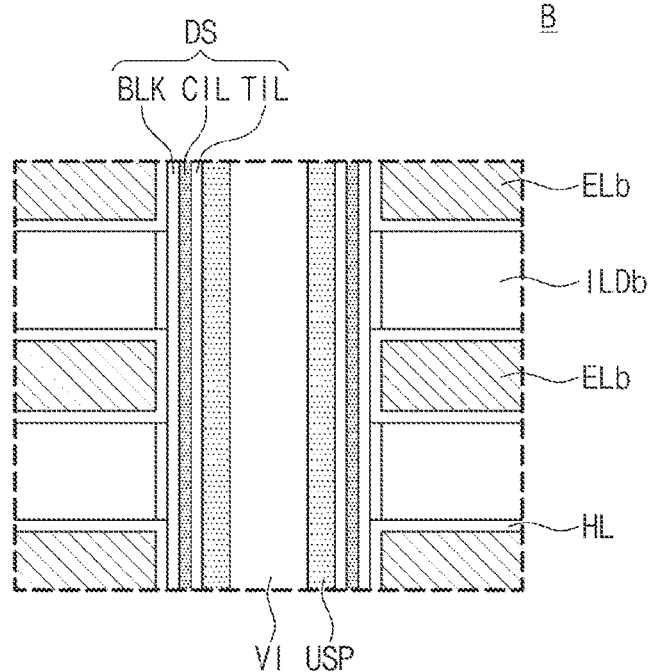
FIG. 6F illustrates an enlarged view showing section B of FIG. 3.

Referring to FIG. 6E, the bottom surfaces of the lower semiconductor patterns LSP included in the first vertical channels VS1 may be lower than the bottom surfaces of the lower semiconductor patterns LSP included in the second vertical channels VS2. In addition, the top surfaces of the lower semiconductor patterns LSP included in the second vertical channels VS2 may be lower than the top surfaces of the lower semiconductor patterns LSP included in the first vertical channels VS1. Alternatively, the lower semiconductor patterns LSP of the first and second vertical channels VS1 and VS2 may have top surfaces at substantially the same level. Referring to FIGS. 6A and 6F, data storage patterns DS may be disposed between the electrode structures ST and the upper semiconductor patterns USP of the first and second vertical channels VS1 and VS2. The data storage pattern DS may extend in the third direction D3 and surround a sidewall of each of the upper semiconductor patterns USP. For example, the data storage pattern DS may have a macaroni or pipe shape whose top and bottom ends are opened.

The data storage pattern DS may include one thin layer or a plurality of thin layers. In some example embodiments, the data storage pattern DS may include a tunnel insulating layer TIL, a charge storage layer CIL, and a blocking insulating layer BLK, which constitute a data storage layer of a NAND Flash memory device. For example, the charge storage layer CIL may be or include a trap insulating layer, a floating gate electrode, or an insulating layer including conductive nanodots. The tunnel insulating layer TIL may be or include one of materials having a band gap greater than that of the charge storage layer CIL, and the blocking insulating layer BLK may be or include a high-k dielectric layer, such as an aluminum oxide layer or a hafnium oxide layer. Alternatively, the data storage pattern DS may include a thin film used for a phase change memory device or a variable resistance memory device.

A horizontal insulating layer HL may be provided between each of the first and second vertical channels VS1 and VS2 and a sidewall of each of the lower and upper electrodes ELa and ELb. The horizontal insulating layers HL may extend from the sidewalls of the lower and upper electrodes ELa and ELb toward top and bottom surfaces of the lower and upper electrodes ELa and ELb. One of the horizontal insulating layers HL may extend toward the top and bottom surfaces of the lower electrode ELa from a gap between the bottom electrode ELa and the vertical gate dielectric layer 103 on one side of the lower semiconductor pattern LSP. The horizontal insulating layer HL may include a blocking insulating layer that serves as a portion of a data storage layer for a NAND Flash memory device.

Referring back to FIGS. 2, 3, 4, and 5, common source regions CSR may be provided in the substrate 10 both on the cell array region CAR and on the connection region CNR, and may extend in the first direction D1 parallel to an extending direction of the electrode structures ST. The common source regions CSR may include impurities (e.g., N-type impurities such as arsenic (As) or phosphorous (P)) whose conductivity is opposite to that of the substrate 10.

The electrode structures ST may be provided therebetween with a common source plug CSPLG coupled to a corresponding one of the common source regions CSR. Insulating spacers SS may be disposed between the common source plugs CSP and sidewalls of the electrode structures ST. Each of the common source plugs CSPLG may have a linear shape extending along the first direction D1 or a pillar shape locally coupled to a corresponding one of the common source regions CSR.

First, second, and third interlayer dielectric layers 130, 140, and 150 may be sequentially stacked on the electrode structures ST and the planarized insulating layer 120. The first interlayer dielectric layer 130 may cover top surfaces of the first and second vertical channels VS1 and VS2.

Subsidiary bit lines SBL may be disposed on the second interlayer dielectric layer 140 on the cell array region CAR, and electrically connected through bit line contact plugs BPLG to the first vertical channels VS1 adjacent to the subsidiary bit lines SBL.

Bit lines BL may be disposed on the third interlayer dielectric layer 150 on the cell array region CAR. Although FIG. 2 omits the bit lines BL, the bit lines BL may extend in the second direction D2, while running across the electrode structure ST. The bit lines BL may be coupled through contact plugs to the subsidiary bit lines SBL.

Cell contact plugs, although omitted in figures, may penetrate the planarized insulating layer 120 on the connection region CNR and may be correspondingly connected to the lower and upper electrodes ELa and ELb of the electrode structures ST. Peripheral contact plugs PPLG may be coupled to the first and second peripheral gate stacks PGS1 and PGS2 and the pick-up impurity regions PUR, while penetrating the first and second interlayer dielectric layers 130 and 140, the planarized insulating layer 120, the lower interlayer dielectric layer ILDa, and the dummy sacrificial pattern DSP. Connection lines CL may be disposed on the second and third interlayer dielectric layers 140 and 150 both on the boundary region BR and on the peripheral circuit region PCR, and coupled to the peripheral contact plugs PPLG.

Figure 7:
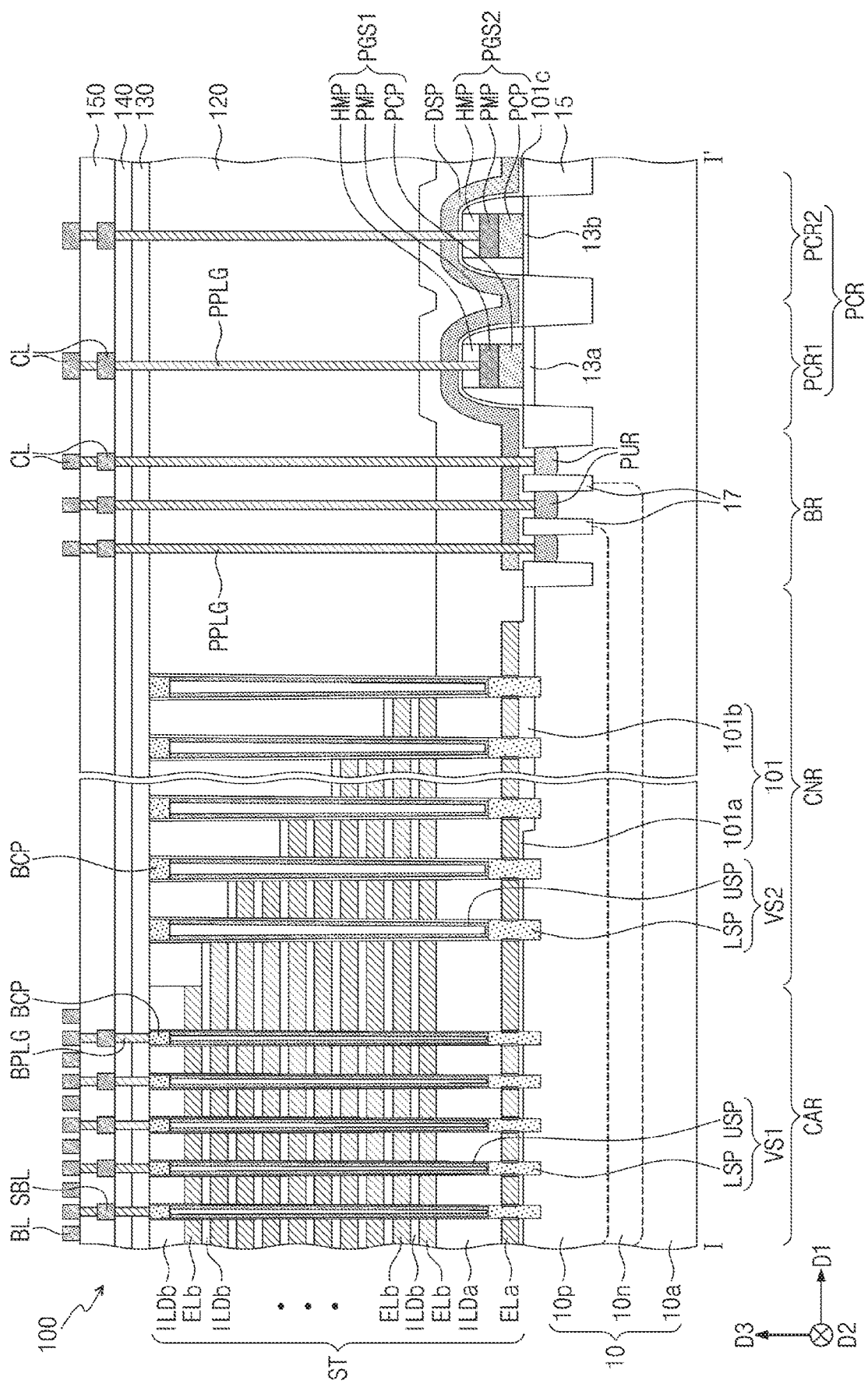
FIGS. 7 and 8 illustrate cross-sectional views taken along line I-I' of FIG. 2, showing a three-dimensional semiconductor memory device according to some example embodiments of the inventive concepts.
Figure 8:
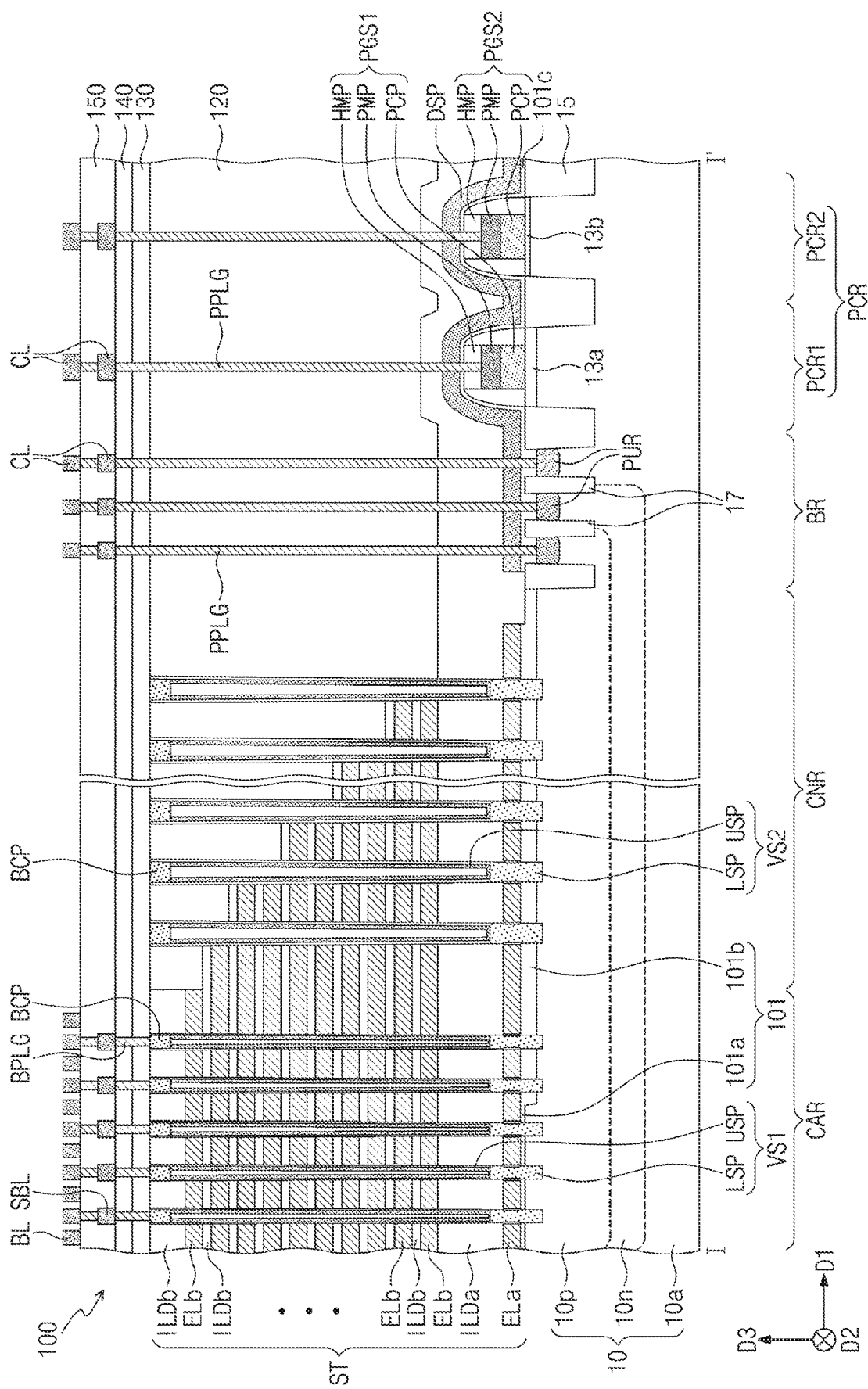
Figure 9:
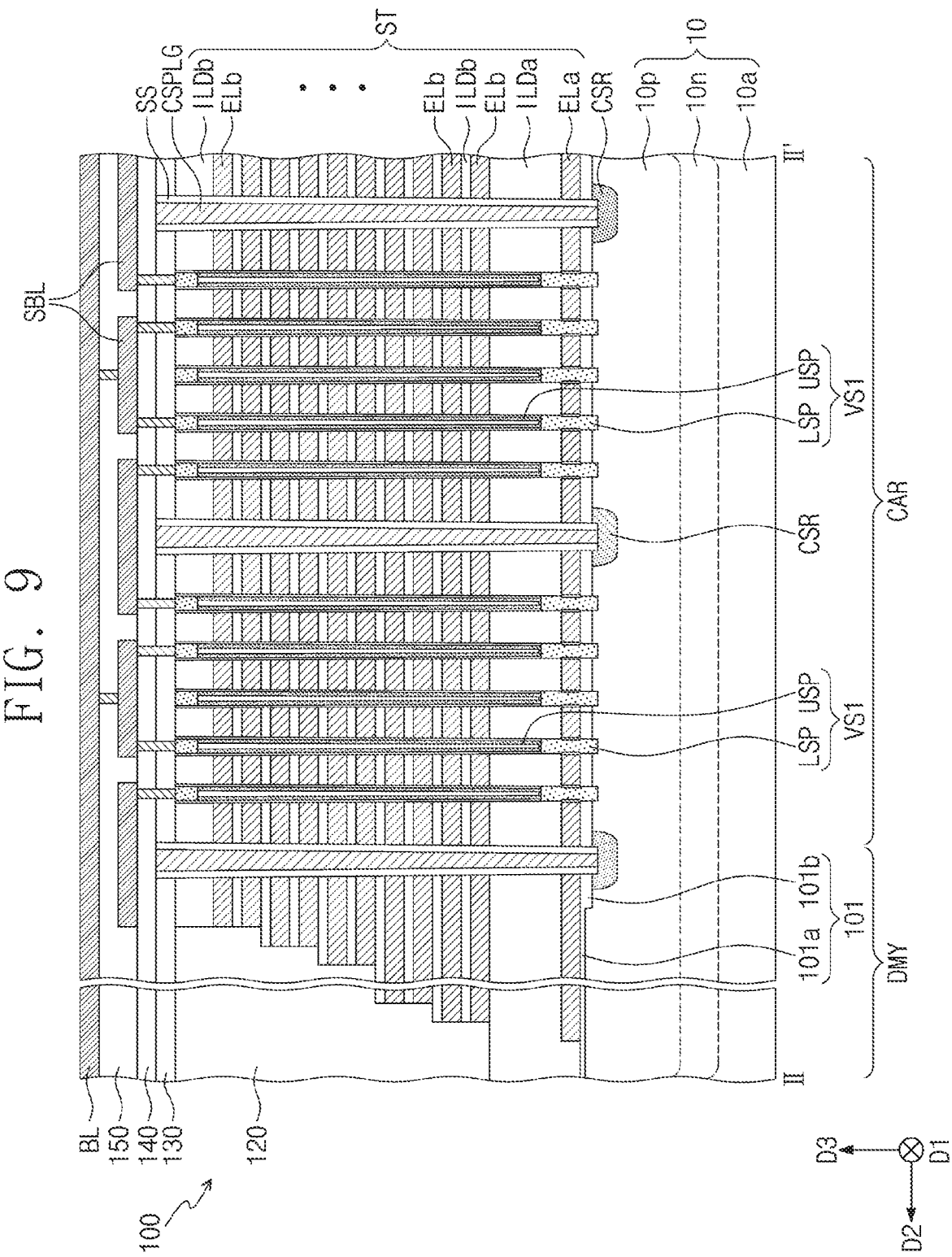
FIG. 9 illustrates a cross-sectional view taken along line II-II' of FIG. 2, showing a three-dimensional semiconductor memory device according to some example embodiments of the inventive concepts.

FIGS. 7 and 8 illustrate cross-sectional views taken along line I-I' of FIG. 2, showing a three-dimensional semiconductor memory device 100 according to some example embodiments of the inventive concepts. FIG. 9 illustrates a cross-sectional view taken along line II-II' of FIG. 2, showing a three-dimensional semiconductor memory device 100 according to some example embodiments of the inventive concepts. For brevity of explanation, a detailed description of technical features the same as those of the three-dimensional semiconductor memory device 100 discussed above may be omitted, and a difference thereof will be described.

Referring to FIGS. 7, 8, and 9, as discussed above, the horizontal gate dielectric layer 101 may have the first portion 101a having a first thickness and the second portion 101b having a second thickness greater than the first thickness.

In the example embodiments shown in FIG. 7, the first portion 101a of the horizontal gate dielectric layer 101 may extend from the cell array region CAR toward a portion of the connection region CNR. On the cell array region CAR, the first vertical channels VS1 may penetrate the first portion 101a of the horizontal gate dielectric layer 101. Ones of the second vertical channels VS2 may penetrate the first portion 101a of the horizontal gate dielectric layer 101, and others of the second vertical channels VS2 may penetrate the second portion 101b of the horizontal gate dielectric layer 101.

In the example embodiments shown in FIG. 8, the second portion 101b of the horizontal gate dielectric layer 101 may extend from the connection region CNR toward a portion of the cell array region CAR. Of the first vertical channels VS1, ones adjacent to the connection region CNR may penetrate the second portion 101b of the horizontal gate dielectric layer 101.

In the example embodiments shown in FIG. 9, of the horizontal gate dielectric layer 101, the second portion 101b having a second thickness may cover the top surface 10T of the substrate 10 on the cell array region CAR. The first portion 101a of the horizontal gate dielectric layer 101 may cover the top surface 10T of the substrate 10 on the dummy region DMY.

FIGS. 10, 11, 12, 13, 14, 15, 16, 17, 18, and 19 illustrate cross-sectional views taken along line I-I' of FIG. 2, showing a method of fabricating a three-dimensional semiconductor memory device 100 according to some example embodiments of the inventive concepts.

Referring to FIGS. 2 and 10, a substrate 10 may include a cell array region CAR, a connection region CNR, a dummy region DMY, a boundary region BR, and a peripheral circuit region PCR. The peripheral circuit region PCR may include a first peripheral circuit region PCR1 and a second peripheral circuit region PCR2.

A buffer insulating layer 11 may be formed on an entire surface of the substrate 10, and then a first mask pattern MP1 may be formed to cover the cell array region CAR, the dummy region DMY, and the second peripheral circuit region PCR2. The buffer insulating layer 11 may be or include a thermal oxide layer or a silicon oxide layer. The first mask pattern MP1 may be used as an etching mask to anisotropically etch the buffer insulating layer 11 and the substrate 10, with the result that a recession may be formed.

The recession may continuously extend from the connection region CNR toward the first peripheral circuit region PCR1. The formation of the recession may cause the substrate 10 to have a top surface that is lower on the connection region CNR than on the cell array region CAR and also lower on the first peripheral circuit region PCR1 than on the second peripheral circuit region PCR2.

After the recession is formed, the first mask pattern MP1 may be removed to expose the buffer insulating layer 11 or the substrate 10.

Referring to FIGS. 2 and 11, a gate dielectric layer 13a and 13b may be formed on the entire surface of the substrate 10. The gate dielectric layer 13a and 13b may include a silicon oxide layer, a silicon nitride layer, or a silicon oxynitride layer, and may fill the recession.

The formation of the gate dielectric layer 13a and 13b may include, after the recession is formed, depositing an insulating layer having a uniform thickness on the entire surface of the substrate 10, forming on the insulating layer a second mask pattern MP2 exposing the cell array region CAR, the dummy region DMY, and the second peripheral circuit region PCR, and using the second mask pattern MP2 as an etching mask to partially etch the insulating layer. The partial etching of the insulating layer may include performing a wet etching process on the insulating layer. The insulating layer may thus have a reduced thickness on its portion exposed by the second mask pattern MP2.

The gate dielectric layer 13a and 13b may be formed to include a first gate dielectric layer 13a having a first thickness and a second gate dielectric layer 13b having a second thickness less than the first thickness. The first gate dielectric layer 13a may fill the recession of the substrate 10, and may extend from the connection region CNR toward the first peripheral circuit region PCR1. The second gate dielectric layer 13b may cover the top surface 10T of the substrate 10 on the cell array region CAR, the dummy region DMY, and the second peripheral circuit region PCR2.

After the formation of the first and second gate dielectric layers 13a and 13b, the second mask pattern MP2 may be removed to expose top surfaces of the first and second gate dielectric layers 13a and 13b.

Referring to FIGS. 2 and 12, the substrate 10 may be doped with impurities to form first and second well impurity layers 10n and 10p. For example, the substrate 10 may be a semiconductor substrate having a first conductivity, and the first well impurity layer 10n may be formed by doping the substrate 10 with impurities having a second conductivity. The second well impurity layer 10p may be formed by doping the first well impurity layer 10n with impurities having the first conductivity.

The first and second well impurity layers 10n and 10p may be provided on the cell array region CAR, the connection region CNR, and the dummy region DMY. The first well impurity layer 10n may also be provided on a portion of the peripheral circuit region PCR.

After the formation of the first and second well impurity layers 10n and 10p, a gate conductive layer 20 may be deposited to have a uniform thickness on the first and second gate dielectric layers 13a and 13b. The gate conductive layer 20 may be or include a polysilicon layer doped with an N-type dopant.

After the formation of the gate conductive layer 20, a device isolation layer 15 may be formed in the substrate 10 on the peripheral circuit region PCR, and guard ring insulating patterns 17 may be formed in the substrate 10 on the boundary region BR. The device isolation layer 15 may define one or more peripheral active areas PACT, and the guard ring insulating patterns 17 may have a ring shape surrounding the cell array region CAR.

The formation of the device isolation layer 15 and the guard ring insulating patterns 17 may include forming trenches by patterning the gate conductive layer 20, the first and second gate dielectric layers 13a and 13b, and the substrate 10, filing the trenches with an insulating material, and performing a planarization process on the insulating material so as to expose a top surface of the gate conductive layer 20.

Referring to FIGS. 2 and 13, a gate metal layer 30 may be formed on the gate conductive layer 20, and hardmask patterns HMP may be formed on the gate metal layer 30 on the first and second peripheral circuit regions PCR1 and PCR2. The gate metal layer 30 may include at least one selected from metal (e.g., tungsten, copper, or aluminum), conductive metal nitride (e.g., titanium nitride or tantalum nitride), transition metal (e.g., titanium or tantalum), and metal silicide (e.g., cobalt silicide or tungsten silicide). The hardmask patterns HMP may include a silicon nitride layer or a silicon oxynitride layer.

Figure 14:
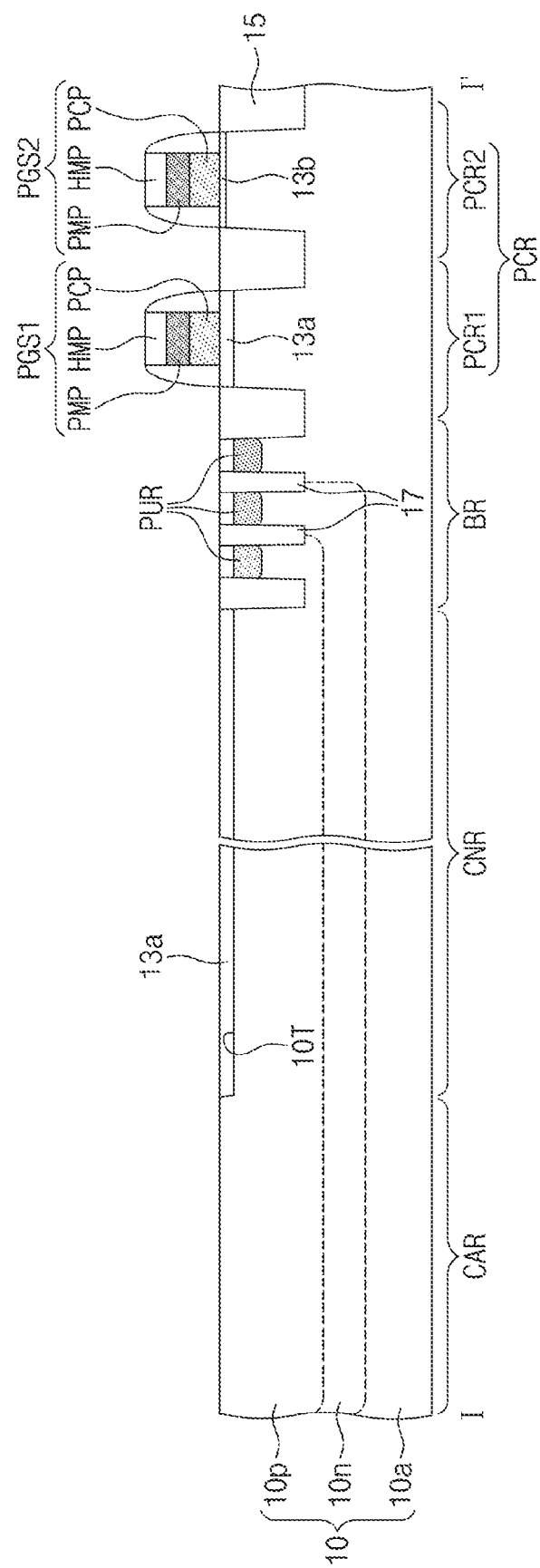

Referring to FIGS. 2 and 14, the hardmask patterns HMP may be used as an etching mask to anisotropically etch the gate metal layer 30 and the gate conductive layer 20, with the result that first and second peripheral gate stacks PGS1 and PGS2 may be respectively formed on the first and second peripheral circuit regions PCR1 and PCR2.

The first peripheral gate stack PGS1 may be formed on the first gate dielectric layer 13a of the first peripheral circuit region PCR1, and the second gate stack PGS2 may be formed on the second gate dielectric layer 13b on the second peripheral circuit region PCR2. Each of the first and second peripheral gate stacks PGS1 and PGS2 may include a gate conductive pattern PCP, a gate metal pattern PMP, and the hardmask pattern HMP.

Gate spacers may be formed to cover opposite sidewalls of each of the first and second peripheral gate stacks PGS1 and PGS2, and source/drain impurity sections may be formed in the peripheral active area PACT on opposite sides of each of the first and second peripheral gate stacks PGS1 and PGS2. The substrate 10 on the boundary region BR may be heavily doped with impurities to form pick-up impurity regions PUR. The pick-up impurity regions PUR may be formed in the substrate 10, the first well impurity layer 10n, and the second well impurity layer 10p.

When the first and second peripheral gate stacks PGS1 and PGS2 and the gate spacers are formed on the peripheral circuit region PCR, the substrate 10 may be exposed on the cell array region CAR, and the second gate dielectric layer 13b may be exposed on the connection region CNR, the dummy region DMY, and the boundary region BR.

Figure 15:
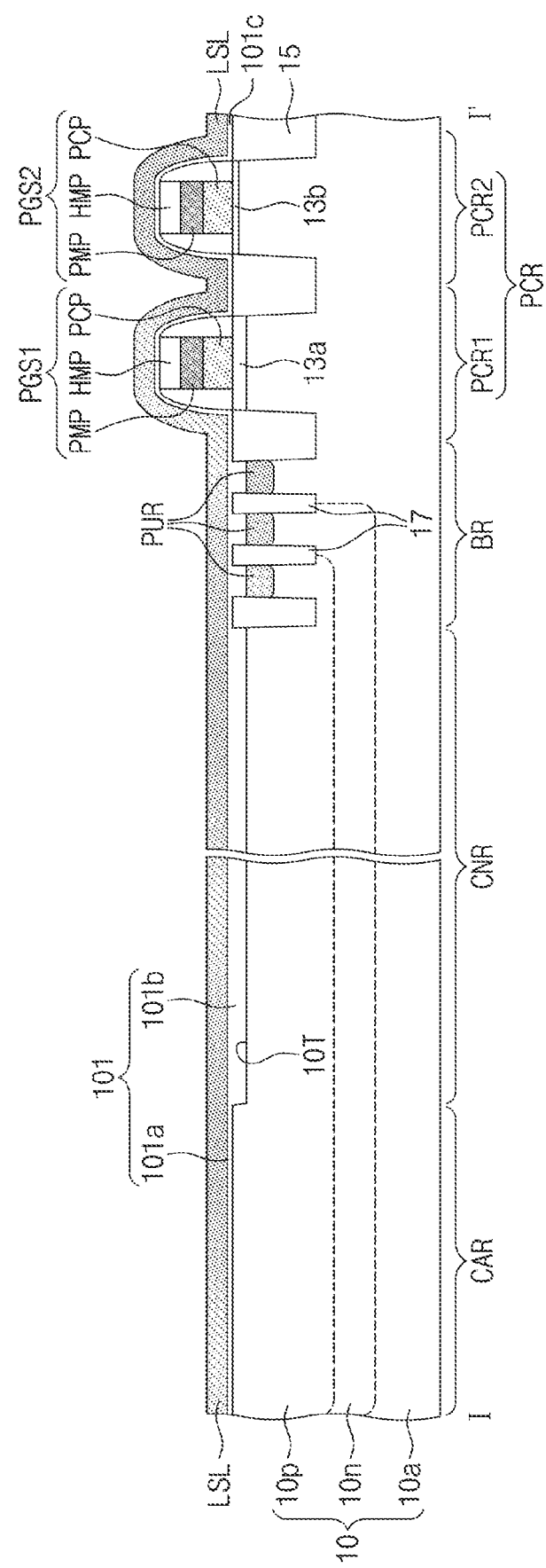

Referring to FIGS. 2 and 15, a lower insulating layer and a lower sacrificial layer LSL may be sequentially formed to cover the entire surface of the substrate 10 on which the first and second peripheral gate stacks PGS1 and PGS2 are formed. The lower insulating layer may be formed by depositing a silicon oxide layer having a uniform thickness on the entire surface of the substrate 10. The lower insulating layer may include an insulating material the same as those of the first and second gate dielectric layers 13a and 13b. For example, the lower insulating layer may include a silicon oxide layer.

Since the lower insulating layer is formed on the entire surface of the substrate 10, a horizontal gate dielectric layer 101 may be formed to cover the top surface 10T of the substrate 10 on the cell array region CAR, the connection region CNR, and the dummy region DMY. The horizontal gate dielectric layer 101 may include a first portion 101a covering the substrate 10 both on the cell array region CAR and on the dummy region DMY, and also include a second portion 101b covering the substrate 10 on the connection region CNR, which second portion 101b may be thicker than the first portion 101a.

The formation of the lower insulating layer may include forming a dummy gate dielectric layer 101c that extends from the second portion 101b of the horizontal gate dielectric layer 101 and conformally covers the first and second peripheral gate stacks PGS1 and PGS2.

The lower sacrificial layer LSL may have a substantially uniform thickness (e.g., uniform thickness within manufacturing tolerances and/or material tolerances) and extend from the cell array region CAR toward the peripheral circuit region PCR. In some example embodiments, the lower sacrificial layer LSL may have a thickness less than those of the first and second peripheral gate stacks PGS1 and PGS2. For example, the lower sacrificial layer LSL on the cell array region CAR may have a top surface lower than those of the first and second peripheral gate stacks PGS1 and PGS2. On the cell array region CAR, the top surface of the lower sacrificial layer LSL may be substantially parallel to the top surface 10T of the substrate 10. For example, the lower sacrificial layer LSL may have a substantially flat top surface on the cell array region CAR.

The lower sacrificial layer LSL may be formed of a material exhibiting an etch selectivity to the horizontal gate dielectric layer 101. The lower sacrificial layer LSL may include a silicon nitride layer.

Figure 16:
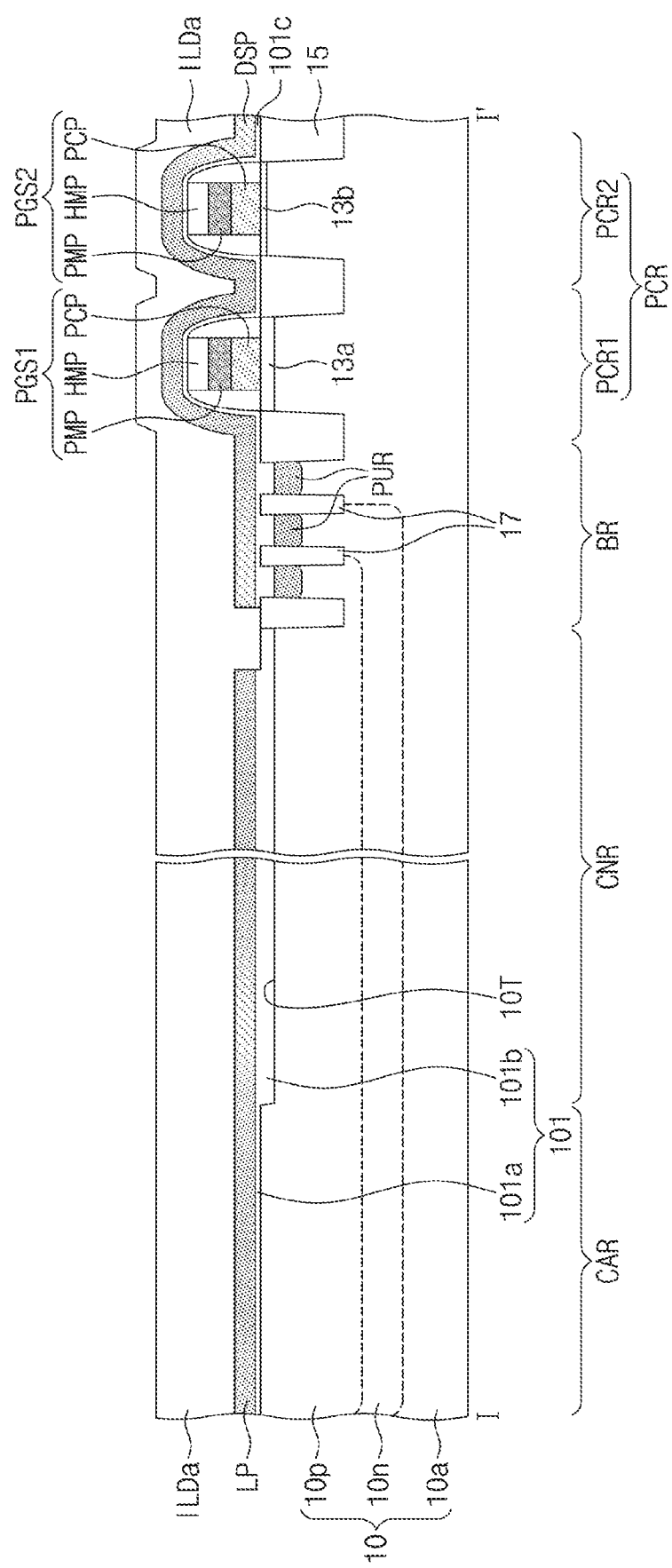

Referring to FIGS. 2 and 16, the lower sacrificial layer LSL may be patterned to form a lower sacrificial pattern LP and a dummy sacrificial pattern DSP that are separated from each other. The dummy sacrificial pattern DSP may cover the top surface 10T of the substrate 10 on the peripheral circuit region PCR and also cover the first and second peripheral gate stacks PGS1 and PGS2, and the lower sacrificial pattern LP may cover the top surface 10T of the substrate 10 on the cell array region CAR, the dummy region DMY, and the connection region CNR.

The lower sacrificial pattern LP may have either a plate shape that covers the entire surface of the substrate 10 on the cell array region CAR, the dummy region DMY, and the connection region CNR, or a linear shape that extends from the cell array region CAR toward the connection region CNR. The lower sacrificial pattern LP may have an opening on the connection region CNR.

A lower interlayer dielectric layer ILDa may be formed to cover the entire surface of the semiconductor substrate 10. The lower interlayer dielectric layer ILDa may be deposited on the lower sacrificial pattern LP and the dummy sacrificial pattern DSP. The lower interlayer dielectric layer ILDa may be deposited to have a substantially uniform thickness. The lower sacrificial pattern LP may have a uniform thickness and a flat top surface on the cell array region CAR, the dummy region DMY, and the connection region CNR, and as a result, the lower interlayer dielectric layer ILDa may have a substantially flat top surface on the cell array region CAR, the dummy region DMY, and the connection region CNR. On the peripheral circuit region PCR, the lower interlayer dielectric layer ILDa may be formed on the dummy sacrificial pattern DSP covering the first and second peripheral gate stacks PGS1 and PGS2, and thus may have a non-flat top surface. For example, the lower interlayer dielectric layer ILDa may have a profile that protrudes convexly upward from each of the first and second peripheral gate stacks PGS1 and PGS2. In some example embodiments, a high density plasma chemical vapor deposition (HDPCVD) method may be used to deposit a silicon oxide layer on the entire surface of the substrate 10, thereby forming the lower interlayer dielectric layer ILDa.

Figure 17:
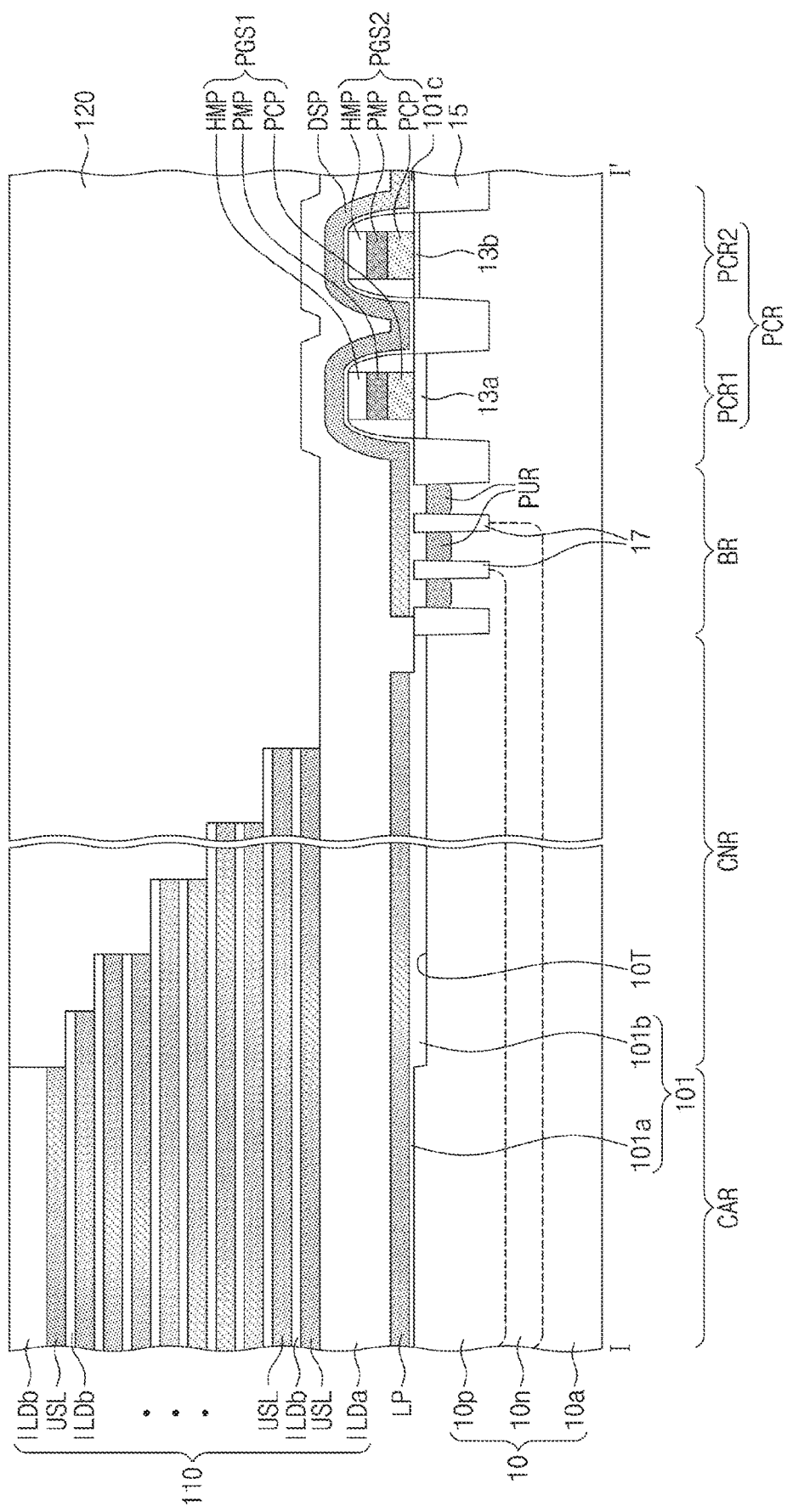

Referring to FIGS. 2 and 17, the lower interlayer dielectric layer ILDa may be provided thereon with a mold structure 110 where upper sacrificial layers USL and upper interlayer dielectric layers ILDb are vertically and alternately stacked. In some example embodiments, the upper sacrificial layers USL may be formed of the same material as that of the lower sacrificial pattern LP. For example, the upper sacrificial layers USL may be formed of a silicon nitride layer, and the upper interlayer dielectric layers ILDb may be formed of a silicon oxide layer, such as a tetraethylorthosilicate (TEOS) layer.

The upper sacrificial layers USL and the upper interlayer dielectric layers ILDb may be patterned to cause the mold structure 110 to have a staircase structure that descends from the cell array region CAR toward the peripheral circuit region PCR. The mold structure 110 may thus have a staircase structure both on the dummy region DMY and on the connection region CNR. In some example embodiments, as discussed above with reference to FIGS. 3 and 4, the mold structure 110 may be configured such that the staircase structure on the dummy region DMY may have a slope different from that of the staircase structure on the connection region CNR.

After the mold structure 110 is formed, the lower interlayer dielectric layer ILDa may be provided thereon with a planarized insulating layer 120 covering the mold structure 110. The planarized insulating layer 120 may have a substantially flat top surface, and on the dummy region DMY and the connection region CNR, may cover the staircase structure of the mold structure 110. The planarized insulating layer 120 may include one insulating layer or a plurality of stacked insulating layers, such as a silicon oxide layer and/or a low-k dielectric layer.

Figure 18:
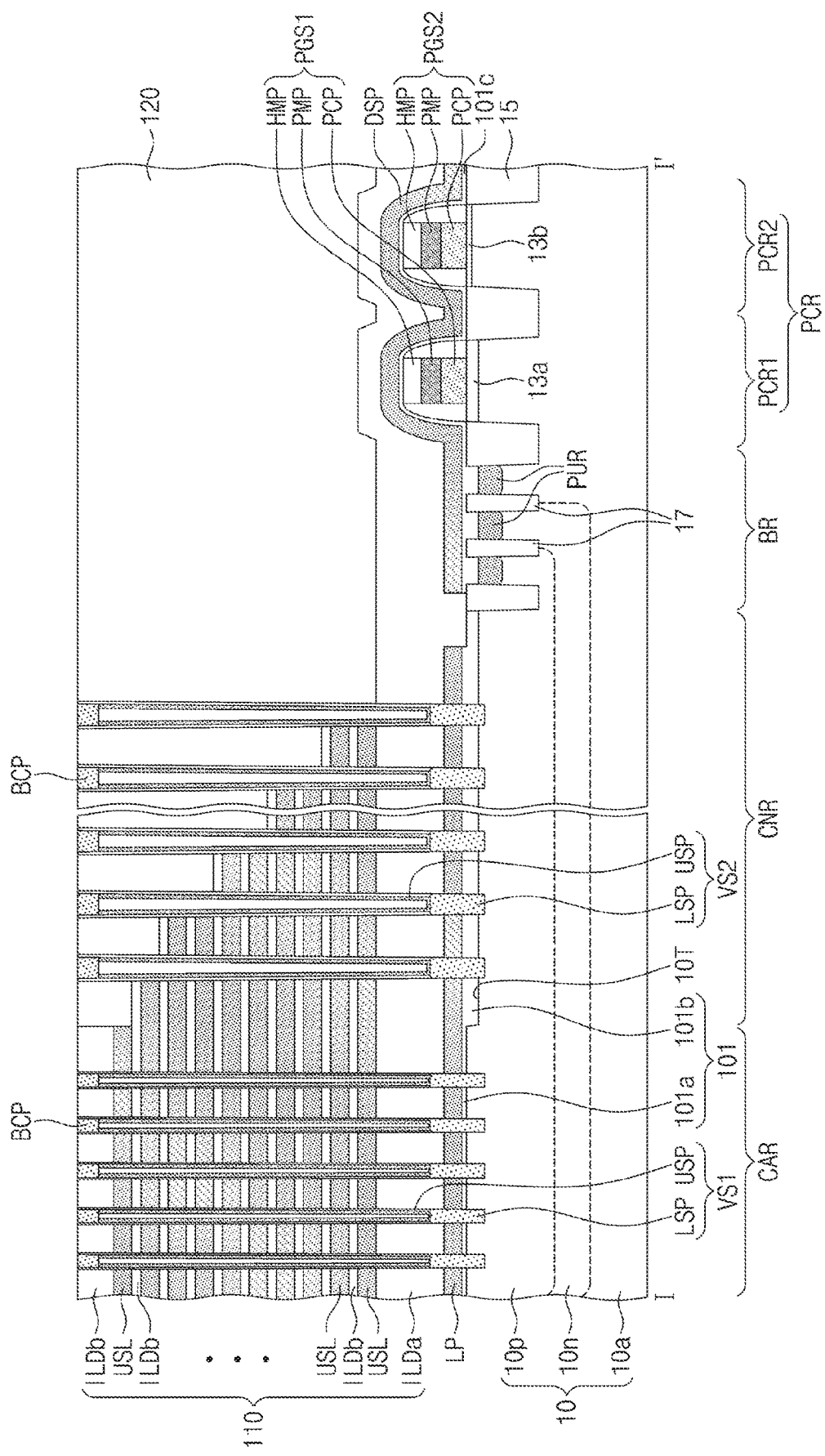

Referring to FIGS. 2 and 18, first and second vertical channels VS1 and VS2 may be formed to penetrate the mold structure 110, the lower interlayer dielectric layer ILDa, the lower sacrificial pattern LP, and the horizontal gate dielectric layer 101. The first vertical channels VS1 may be connected to the substrate 10 on the cell array region CAR, and the second vertical channels VS2 may be connected to the substrate 10 on the connection region CNR. The second vertical channels VS2 may penetrate the staircase structure of the mold structure 110. As discussed above, the second vertical channels VS2 may have widths greater than those of the first vertical channels VS1.

The formation of the first and second vertical channels VS1 and VS2 may include forming vertical holes exposing the substrate 10 that penetrate the mold structure 110, the lower interlayer dielectric layer ILDa, the lower sacrificial pattern LP, and the horizontal gate dielectric layer 101, and then forming a lower semiconductor pattern LSP and an upper semiconductor pattern USP in each of the vertical holes.

The lower semiconductor pattern LSP may be an epitaxial pattern that is formed by a selective epitaxial growth (SEG) process in which the substrate 10 exposed to the vertical holes is used as a seed layer. The lower semiconductor pattern LSP may be formed to have a pillar shape that fills a lower portion of the vertical hole. The lower semiconductor pattern LSP may have a top surface higher than that of the lower sacrificial pattern LP.

The upper semiconductor pattern USP may be formed in the vertical hole in which the lower semiconductor pattern LSP is formed. The upper semiconductor pattern USP may be in contact with the lower semiconductor pattern LSP. The upper semiconductor pattern USP may be formed by depositing in the hole a semiconductor layer having a uniform thickness. The semiconductor layer may be conformally formed to have a thickness that does not completely fill the vertical hole. Accordingly, the upper semiconductor pattern USP may define an empty space (or gap) in the vertical hole, and the empty space may be filled with a buried insulating layer or air. A bit line conductive pad BCP may be formed on a top end of the upper semiconductor pattern USP. The bit line conductive pad BCP may be an impurity-doped region or may consist of a conductive material.

In some example embodiments, before the upper semiconductor pattern USP is formed, a data storage pattern DS may be formed in the vertical hole, as discussed with reference to FIGS. 6A and 6F. The formation of the data storage pattern DS may include depositing a data storage layer and a first semiconductor layer each having a uniform thickness on inner sidewalls of the vertical holes, and then performing an anisotropic etching process on the data storage layer and the first semiconductor layer to partially expose the lower semiconductor patterns LSP.

Figure 19:
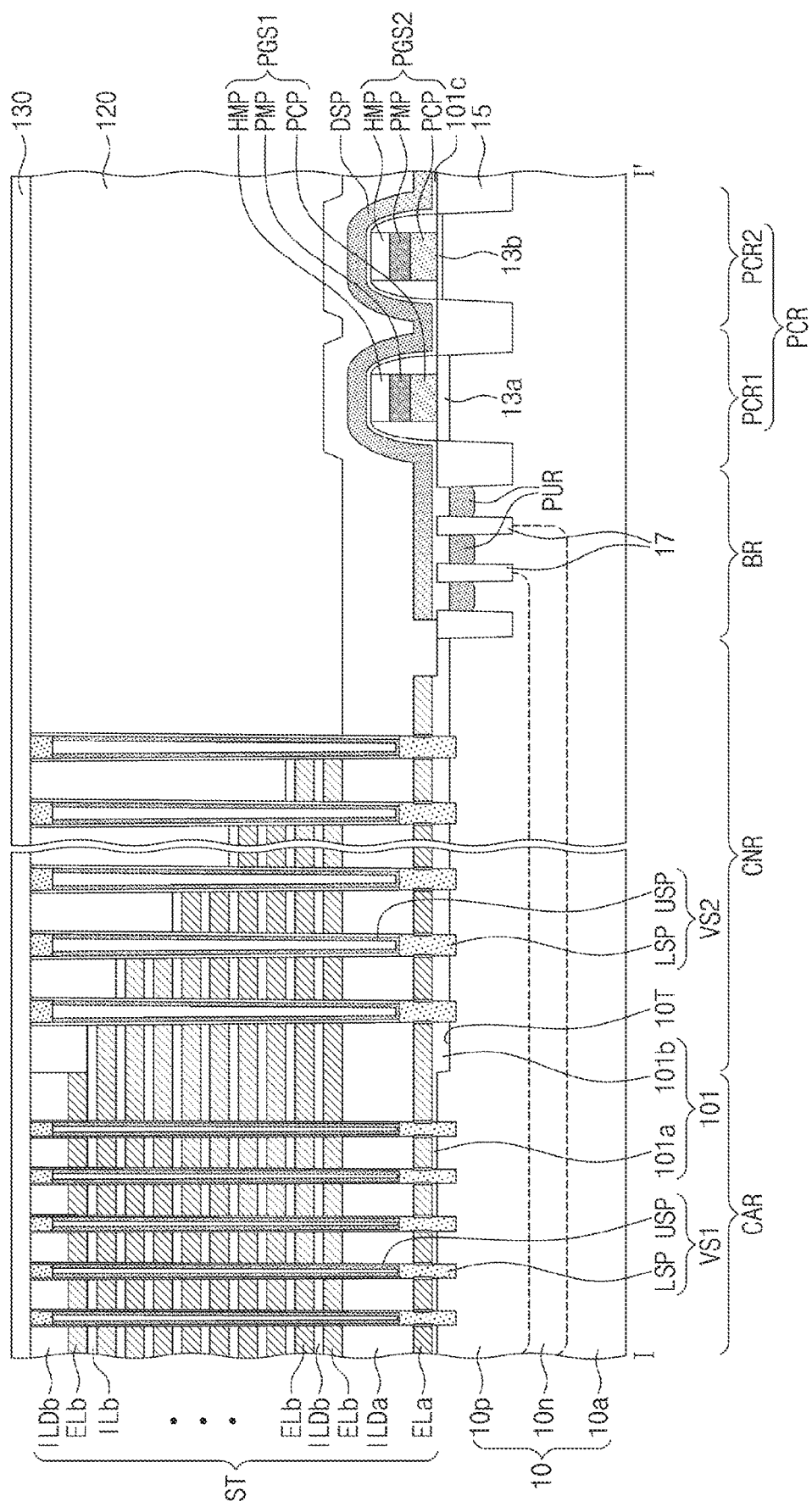

Referring to FIGS. 2 and 19, a first interlayer dielectric layer 130 may be formed to cover top surfaces of the first and second vertical channels VS1 and VS2. After the first interlayer dielectric layer 130 is formed, trenches may be formed to penetrate the mold structure 110 and to expose the substrate 10. The trenches may extend in a first direction D1 and may be spaced apart from each other in a second direction D2.

After the trenches are formed, the lower sacrificial pattern LP and the upper sacrificial layers USL exposed to the trenches may be replaced with a lower electrode ELa and upper electrodes ELb. Thus, the substrate 10 may be provided thereon with electrode structures ST each including the lower and upper electrodes ELa and ELb and the lower and upper interlayer dielectric layers ILDa and ILDb that are vertically and alternately stacked. For example, the lower and upper electrodes ELa and ELb may include one or more of a metal nitride layer, such as TiN, TaN, or WN, and a metal layer, such as W, Al, Ti, Ta, Co, or Cu.

Before the lower and upper electrodes ELa and ELb are formed, a horizontal insulating layer (see HL of FIG. 6A) may be formed to conformally fill empty spaces where the lower sacrificial pattern LP and the upper sacrificial layers USL are removed. The horizontal insulating layer HL may be a portion of a data storage layer for a NAND Flash memory transistor. Before the horizontal insulating layer HL is formed, a vertical gate dielectric layer 103 consisting of a thermal oxide layer may be formed on a sidewall of the lower semiconductor pattern LSP.

Common source regions CSR may be formed in the substrate 10 exposed to the trenches. The common source regions CSR may extend in parallel in the first direction D1 and may be spaced apart from each other in the second direction D2. The common source regions CSR may be formed by doping the substrate 10 with impurities whose conductivity is different from that of the substrate 10. The common source regions CSR may include, for example, N-type impurities (e.g., arsenic (As) or phosphorous (P)).

As discussed with reference to FIGS. 2, 3, 4, and 5, insulating spacers SS may be formed to cover sidewalls of the electrode structure ST, and common source plugs CSPLG may be formed in the trenches where the insulating spacers SS are formed.

Second and third interlayer dielectric layers 140 and 150 may be stacked on the first interlayer dielectric layer 130, and bit line contact plugs BPLG may be formed to penetrate the first and second interlayer dielectric layers 130 and 140 to come into connection with corresponding first vertical channels VS1. On the connection region CNR and the peripheral circuit region PCR, cell contact plugs (not shown) and peripheral contact plugs PPLG may be formed to electrically connect the electrodes ELa and ELb to peripheral logic circuits.

Subsidiary bit lines SBL may be formed on the second interlayer dielectric layer 140 on the cell array region CAR, and bit lines BL may be formed on the third interlayer dielectric layer 150 on the cell array region CAR. The bit lines BL may be electrically connected to the first vertical channels VS1 through the bit line contact plugs BPLG and the subsidiary bit lines SBL.

According to some example embodiments of the inventive concepts, a portion of the horizontal gate dielectric layer on the connection region may be formed simultaneously with high-voltage transistors on the peripheral circuit region. Accordingly, the horizontal gate dielectric layer may have a substantially uniform thickness and a flat surface on the connection region.

The horizontal gate dielectric layer may be disposed between the electrode structure and the substrate, and may be thicker on the connection region than on the cell array region. Therefore, when a three-dimensional semiconductor memory device 100 is operated, on the connection region, it may be possible to prevent an electric leakage occurred due to breakage of the horizontal gate dielectric layer adjacent to the vertical channels. In conclusion, the three-dimensional semiconductor memory device 100 may improve in reliability and electrical characteristics.

Although the present inventive concepts has been described in connection with some example embodiments of inventive concepts illustrated in the accompanying drawings, it will be understood to those skilled in the art that various changes and modifications may be made without departing from the technical spirit and essential feature of inventive concepts. It will be apparent to those skilled in the art that various substitution, modifications, and changes may be thereto without departing from the scope and spirit of the inventive concepts.

What is claimed is:

1. A three-dimensional semiconductor memory device, comprising:
    a substrate including a cell array region and a connection region;
    an electrode structure on the substrate, the electrode structure including a plurality of electrodes stacked on a top surface of the substrate in a vertical direction substantially perpendicular to the top surface of the substrate;
    a horizontal gate dielectric layer between the electrode structure and the substrate, the horizontal gate dielectric layer including a first portion and a second portion, the first portion of the horizontal gate dielectric layer on the cell array region of the substrate, the second portion of the horizontal gate dielectric layer on the connection region of the substrate, the second portion thicker than the first portion in the vertical direction, and a bottom surface of the second portion of the horizontal gate dielectric layer is at a lower level than a bottom surface of the first portion of the horizontal gate dielectric layer;
    a plurality of first vertical channels on the cell array region of the substrate, the plurality of first vertical channels penetrating the electrode structure and the first portion of the horizontal gate dielectric layer; and
    a plurality of second vertical channels on the connection region of the substrate, the plurality of second vertical channels penetrating the electrode structure and the second portion of the horizontal gate dielectric layer,
    wherein each vertical channel of the plurality of first vertical channels and the plurality of second vertical channels includes a lower semiconductor pattern and an upper semiconductor pattern on the lower semiconductor pattern,
    wherein a top surface of a lowermost electrode of the plurality of electrodes is lower than top surfaces of the lower semiconductor patterns of the plurality of first vertical channels and the plurality of second vertical channels, and
    wherein a bottom surface of the lowermost electrode is higher than bottom surfaces of the lower semiconductor patterns of the plurality of first vertical channels and the plurality of second vertical channels.

2. The device of claim 1, wherein top surfaces of the first and second portions of the horizontal gate dielectric layer are substantially coplanar with each other.

3. The device of claim 1, further comprising:
    a device isolation layer on a peripheral circuit region of the substrate, the device isolation layer defining a peripheral active area,
    wherein the bottom surface of the second portion of the horizontal gate dielectric layer is at a higher level than a bottom surface of the device isolation layer.

4. The device of claim 1, wherein each vertical channel of the plurality of first vertical channels and the plurality of second vertical channels includes
    an epitaxial pattern penetrating the lowermost electrode of the plurality of electrodes, the epitaxial pattern connected to the substrate; and
    a semiconductor pattern on the epitaxial pattern.

5. The device of claim 4, wherein top surfaces of the epitaxial patterns of the plurality of second vertical channels are proximate to a bottom surface of the substrate in relation to top surfaces of the epitaxial patterns of the plurality of first vertical channels.

6. The device of claim 4, wherein the epitaxial patterns of the plurality of second vertical channels have respective lengths that are smaller than respective lengths of the epitaxial patterns of the plurality of first vertical channels.

7. The device of claim 4, wherein respective bottom surfaces of the plurality of second vertical channels are proximate to the bottom surface of the substrate in relation to respective bottom surfaces of the plurality of first vertical channels.

8. The device of claim 4, wherein
    each first vertical channel of the plurality of first vertical channels has a first width, and
    each second vertical channel of the plurality of second vertical channels has a second width, the second width greater than the first width.

9. The device of claim 1, wherein
    the electrode structure has a first staircase structure that descends from the connection region toward a peripheral circuit region of the substrate, and
    when viewed in plan, the first staircase structure overlaps the second portion of the horizontal gate dielectric layer in the vertical direction.

10. The device of claim 1, further comprising:
    a first peripheral circuit region including a first gate dielectric layer and a first peripheral gate stack on the first gate dielectric layer; and
    a second peripheral circuit region including a second gate dielectric layer and a second peripheral gate stack on the second gate dielectric layer, the second gate dielectric layer thinner than the first gate dielectric layer in the vertical direction,
    wherein the first peripheral gate stack is closer than the second peripheral gate stack to the electrode structure, and
    wherein a thickness of the second portion of the horizontal gate dielectric layer in the vertical direction is substantially equal to or greater than a thickness of the first gate dielectric layer in the vertical direction.

11. The device of claim 10, wherein
    the electrode structure further includes a plurality of interlayer dielectric layers, each interlayer dielectric layer of the plurality of interlayer dielectric layers between a separate pair of adjacent electrodes of the plurality of electrodes, and
    one interlayer dielectric layer of the plurality of interlayer dielectric layers covers the first and second peripheral gate stacks.

12. A three-dimensional semiconductor memory device, comprising:
    a substrate including a cell array region, and a connection region;

an electrode structure on the substrate, the electrode structure including a plurality of electrodes stacked on a top surface of the substrate in a vertical direction substantially perpendicular to the top surface of the substrate;

a horizontal gate dielectric layer between the electrode structure and the substrate, the horizontal gate dielectric layer including a first portion and a second portion, the first portion of the horizontal gate dielectric layer on the cell array region of the substrate, the second portion of the horizontal gate dielectric layer on the connection region of the substrate, the second portion thicker than the first portion in the vertical direction;

a first vertical channel penetrating the electrode structure on the cell array region and the first portion of the horizontal gate dielectric layer, the first vertical channel including a first lower channel pattern and a first upper channel pattern connected to the first lower channel pattern; and a second vertical channel penetrating the electrode structure on the connection region and the second portion of the horizontal gate dielectric layer, the second vertical channel including a second lower channel pattern and a second upper channel pattern connected to the second lower channel pattern, wherein a lowermost electrode of the plurality of electrodes surrounds the first lower channel pattern and the second lower channel pattern, and wherein a bottom surface of the second lower channel pattern is positioned at a different level from a bottom surface of the first lower channel pattern and wherein the bottom surface of the second lower channel pattern is positioned at a lower level than a bottom surface of the second portion of the horizontal gate dielectric layer.

13. The device of claim 12, wherein the bottom surface of the second portion of the horizontal gate dielectric layer is at a lower level than a bottom surface of the first portion of the horizontal gate dielectric layer.

14. The device of claim 12, wherein a top surface of the lowermost electrode of the plurality of electrodes is lower than top surfaces of lower semiconductor patterns of the first vertical channel and the second vertical channel.

15. The device of claim 12, wherein the bottom surface of the second lower channel pattern is higher than the bottom surface of the first lower channel pattern.

16. The device of claim 12, wherein top surfaces of the first and second portions of the horizontal gate dielectric layer are substantially coplanar with each other.

17. The device of claim 12, further comprising:
a device isolation layer on a peripheral circuit region of the substrate, the device isolation layer defining a peripheral active region;
a first gate dielectric layer on the peripheral active region and a first peripheral gate stack on the first gate dielectric layer,
wherein a thickness of the second portion of the horizontal gate dielectric layer in the vertical direction is substantially equal to or greater than a thickness of the first gate dielectric layer in the vertical direction.

18. The device of claim 12, wherein the electrode structure has a first staircase structure on the connection region, and
when viewed in plan, the first staircase structure overlaps the second portion of the horizontal gate dielectric layer in the vertical direction.

19. A three-dimensional semiconductor memory device, comprising:
a substrate including a cell array region, and a connection region;
an electrode structure on the substrate, the electrode structure including a plurality of electrodes stacked on a top surface of the substrate in a vertical direction substantially perpendicular to the top surface of the substrate;
a horizontal gate dielectric layer between the electrode structure and the substrate, the horizontal gate dielectric layer including a first portion and a second portion, the first portion of the horizontal gate dielectric layer on the cell array region of the substrate, the second portion of the horizontal gate dielectric layer on the connection region of the substrate;
a first vertical channel penetrating the electrode structure on the cell array region and the first portion of the horizontal gate dielectric layer, the first vertical channel including a first lower channel pattern and a first upper channel pattern connected to the first lower channel pattern; and
a second vertical channel penetrating the electrode structure on the connection region and the second portion of the horizontal gate dielectric layer, the second vertical channel including a second lower channel pattern and a second upper channel pattern connected to the second lower channel pattern,
wherein a top surface of a lowermost electrode of the plurality of electrodes is lower than top surfaces of the first and second lower channel patterns,
wherein a bottom surface of the lowermost electrode is higher than bottom surfaces of the first and second lower channel patterns,
wherein the first portion of the horizontal gate dielectric layer has a first thickness, the second portion of the horizontal gate dielectric layer has a second thickness greater than the first thickness, and the second lower channel pattern has a third thickness greater than the second thickness in the vertical direction.

20. The device of claim 19, wherein a bottom surface of the second lower channel pattern is positioned at a different level from a bottom surface of the first lower channel pattern.

21. The device of claim 19, wherein a bottom surface of the second portion of the horizontal gate dielectric layer is at a lower level than a bottom surface of the portion of the horizontal gate dieletric layer, and
wherein top surfaces of the first and second portions of the horizontal gate dielectric layer are substantially coplanar with each other.

* * * * *